US012571839B2

(12) United States Patent
Kim et al.

(10) Patent No.: US 12,571,839 B2
(45) Date of Patent: Mar. 10, 2026

(54) METHOD OF INSPECTING A SENSOR

(71) Applicant: Samsung Display Co., LTD., Yongin-si (KR)

(72) Inventors: Keeyong Kim, Hwaseong-si (KR); Jun-Young Ko, Seoul (KR); Eunsol Seo, Yongin-si (KR); Junghun Sin, Seoul (KR); Junseong Lee, Hwaseong-si (KR); Jaewoo Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 593 days.

(21) Appl. No.: 17/882,592

(22) Filed: Aug. 7, 2022

(65) Prior Publication Data

US 2023/0045474 A1  Feb. 9, 2023

(30) Foreign Application Priority Data

Aug. 9, 2021  (KR) ........................ 10-2021-0104774

(51) Int. Cl.
G01R 31/28  (2006.01)

(52) U.S. Cl.
CPC ................................ G01R 31/2894 (2013.01)

(58) Field of Classification Search
CPC ............ G01R 31/2829; G01R 31/2894; G06F 3/0418; G06F 3/0446
See application file for complete search history.

(56) References Cited

U.S. PATENT DOCUMENTS

| | | | | |
|---|---|---|---|---|
| 6,396,484 | B1 * | 5/2002 | Adler ................... | G06F 3/0436 |
| | | | | 345/173 |
| 9,310,900 | B1 * | 4/2016 | Kumar ................... | G06F 3/041 |
| 9,740,332 | B1 * | 8/2017 | Lee ...................... | G06F 3/03547 |
| 2013/0137498 | A1 * | 5/2013 | Willyard ............. | G06F 11/3688 |
| | | | | 463/16 |
| 2017/0064475 | A1 * | 3/2017 | Kingscott .......... | G01R 31/3865 |
| 2019/0196653 | A1 * | 6/2019 | Yarosh .................. | G06F 3/0446 |
| 2019/0369498 | A1 | 12/2019 | Feng et al. | |
| 2021/0294479 | A1 * | 9/2021 | Moscovich ............. | G06F 3/045 |

FOREIGN PATENT DOCUMENTS

| | | |
|---|---|---|
| KR | 10-1998-0013165 | 4/1998 |
| KR | 10-0307216 | 11/2001 |
| KR | 10-0848127 | 7/2008 |

(Continued)

OTHER PUBLICATIONS

CN-102929458—English Translation (Year: 2016).*

*Primary Examiner* — Michael J Dalbo
(74) *Attorney, Agent, or Firm* — CANTOR COLBURN LLP

(57) ABSTRACT

A method of inspecting a sensor including generating a first model based on first big-data including first inspection results for sensors of a same type connected to a current inspection environment, generating first target characteristic coefficients for channels included in the first model, generating first characteristic coefficients for channels included in a current sensor, and generating first compensation coefficients for the channels included in the current sensor based on the first target characteristic coefficients and the first characteristic coefficients.

15 Claims, 28 Drawing Sheets

(56)         References Cited

FOREIGN PATENT DOCUMENTS

| KR | 10-1358099 | 2/2014 |
| KR | 10-1616949 | 5/2016 |
| KR | 10-1722403 | 4/2017 |
| KR | 10-2019-0108609 | 9/2019 |
| KR | 10-2020-0107500 | 9/2020 |

\* cited by examiner

FIG. 2
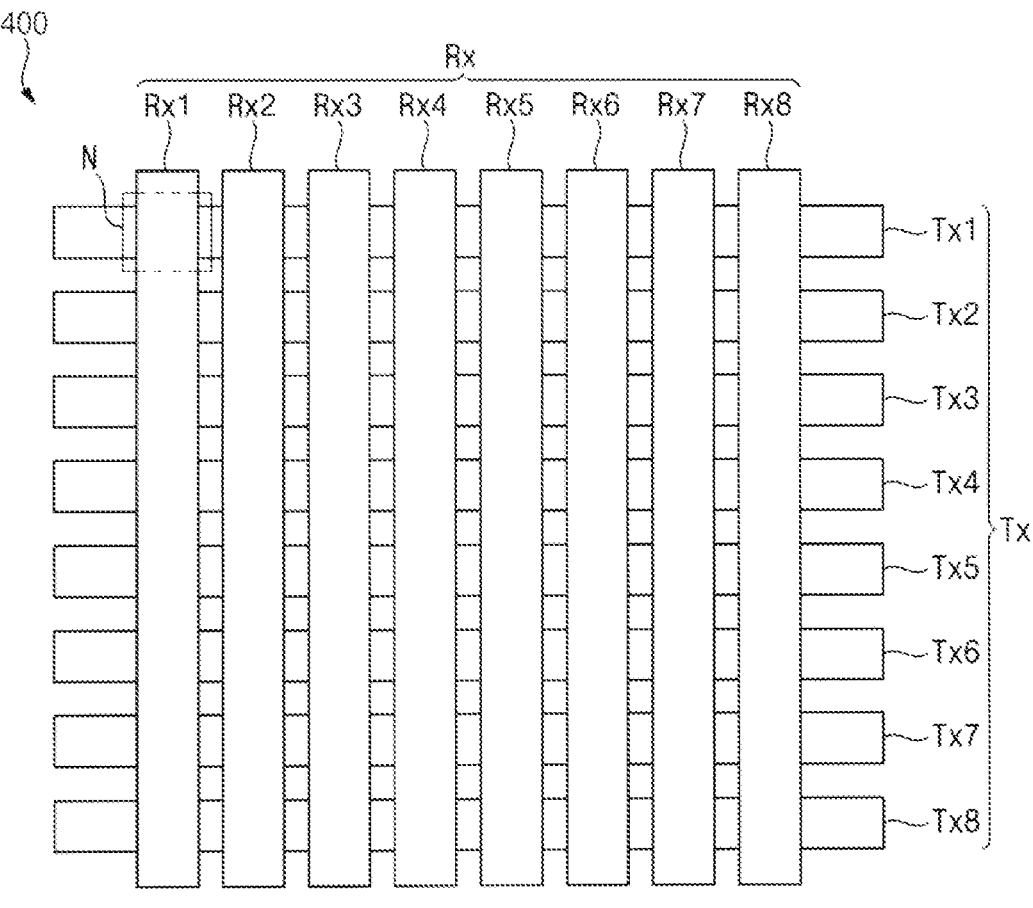
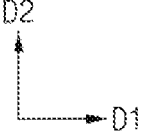

FIG. 6

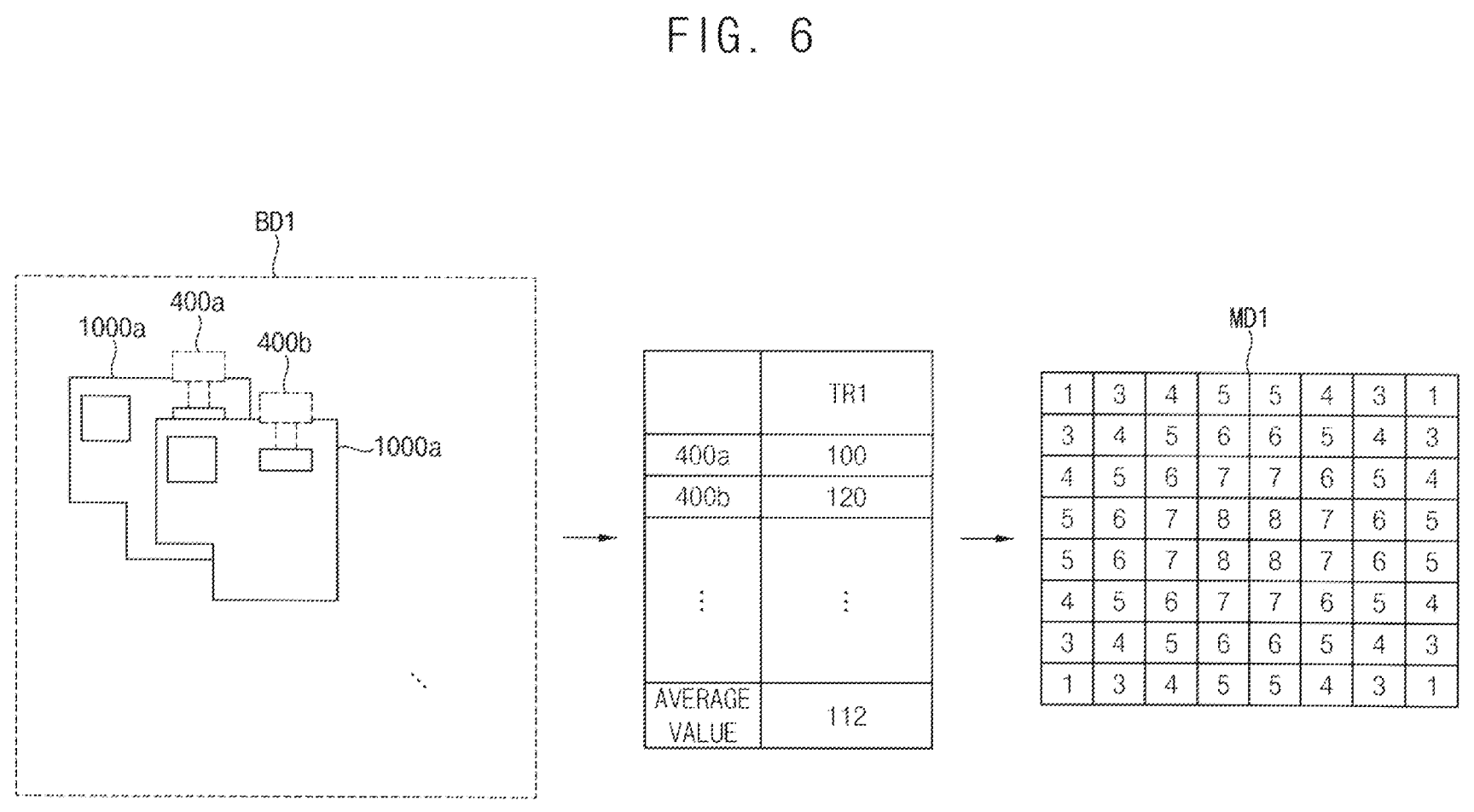

| | MD1 | | | | | | | |
|---|---|---|---|---|---|---|---|---|
| 1 | 3 | 4 | 5 | 5 | 4 | 3 | 1 |
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

| | TR1 |
|---|---|
| 400a | 100 |
| 400b | 120 |
| ... | ... |
| AVERAGE VALUE | 112 |

| 1# | 2# | 3# | 4# | 5# | 6# | 7# | 8# |
|----|----|----|----|----|----|----|----|
| 9# | 10# | 11# | 12# | 13# | 14# | 15# | 16# |
| 17# | 18# | 19# | 20# | 21# | 22# | 23# | 24# |
| 25# | 26# | 27# | 28# | 29# | 30# | 31# | 32# |
| 33# | 34# | 35# | 36# | 37# | 38# | 39# | 40# |
| 41# | 42# | 43# | 44# | 45# | 46# | 47# | 48# |
| 49# | 50# | 51# | 52# | 53# | 54# | 55# | 56# |
| 57# | 58# | 59# | 60# | 61# | 62# | 63# | 64# |

FIG. 15

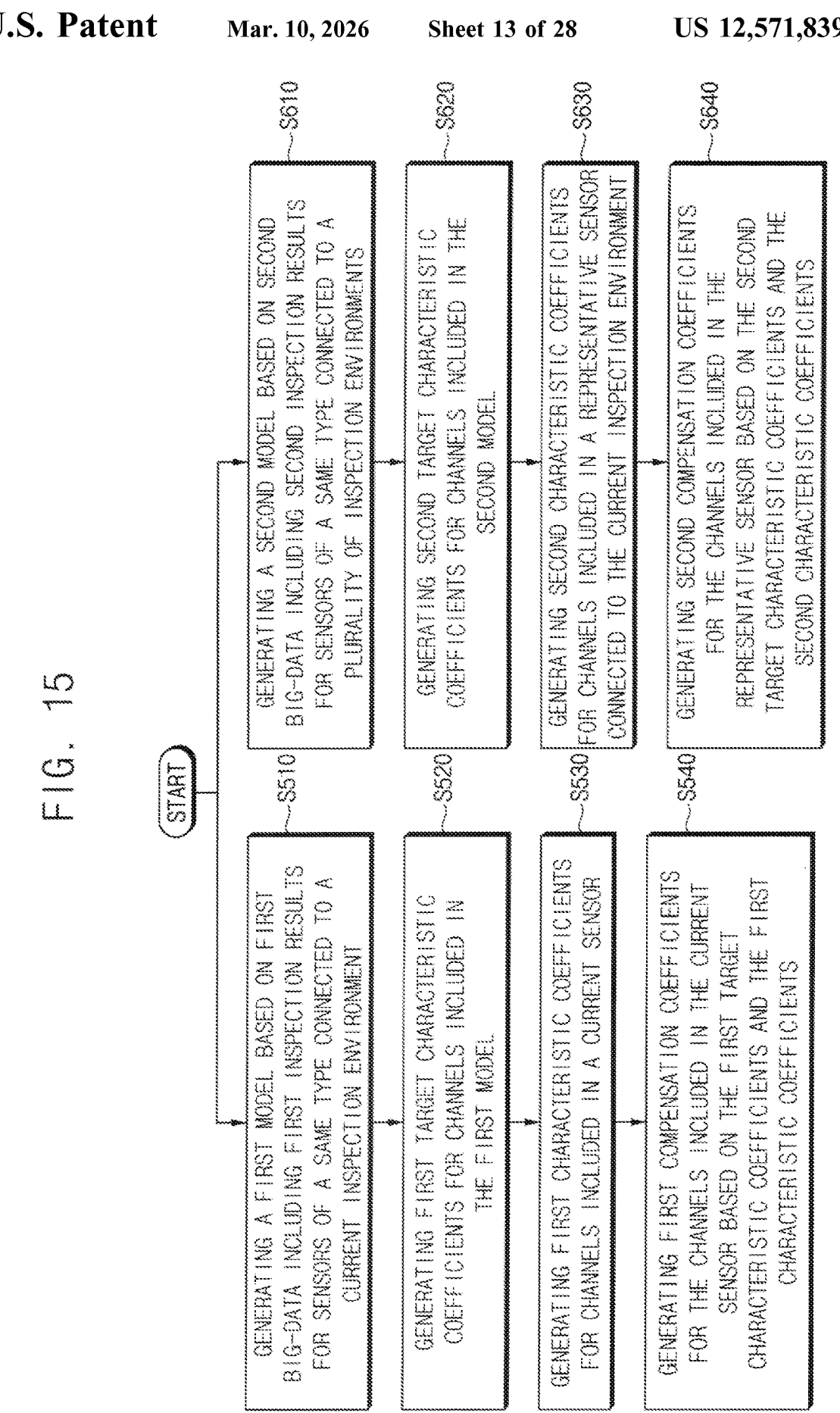

START

S510 — GENERATING A FIRST MODEL BASED ON FIRST BIG-DATA INCLUDING FIRST INSPECTION RESULTS FOR SENSORS OF A SAME TYPE CONNECTED TO A CURRENT INSPECTION ENVIRONMENT

S610 — GENERATING A SECOND MODEL BASED ON SECOND BIG-DATA INCLUDING SECOND INSPECTION RESULTS FOR SENSORS OF A SAME TYPE CONNECTED TO A PLURALITY OF INSPECTION ENVIRONMENTS

S520 — GENERATING FIRST TARGET CHARACTERISTIC COEFFICIENTS FOR CHANNELS INCLUDED IN THE FIRST MODEL

S620 — GENERATING SECOND TARGET CHARACTERISTIC COEFFICIENTS FOR CHANNELS INCLUDED IN THE SECOND MODEL

S530 — GENERATING FIRST CHARACTERISTIC COEFFICIENTS FOR CHANNELS INCLUDED IN A CURRENT SENSOR

S630 — GENERATING SECOND CHARACTERISTIC COEFFICIENTS FOR CHANNELS INCLUDED IN A REPRESENTATIVE SENSOR CONNECTED TO THE CURRENT INSPECTION ENVIRONMENT

S540 — GENERATING FIRST COMPENSATION COEFFICIENTS FOR THE CHANNELS INCLUDED IN THE CURRENT SENSOR BASED ON THE FIRST TARGET CHARACTERISTIC COEFFICIENTS AND THE FIRST CHARACTERISTIC COEFFICIENTS

S640 — GENERATING SECOND COMPENSATION COEFFICIENTS FOR THE CHANNELS INCLUDED IN THE REPRESENTATIVE SENSOR BASED ON THE SECOND TARGET CHARACTERISTIC COEFFICIENTS AND THE SECOND CHARACTERISTIC COEFFICIENTS

| 1 | 3 | 4 | 5 | 5 | 4 | 3 | 1 |
|---|---|---|---|---|---|---|---|
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

Figure 17:
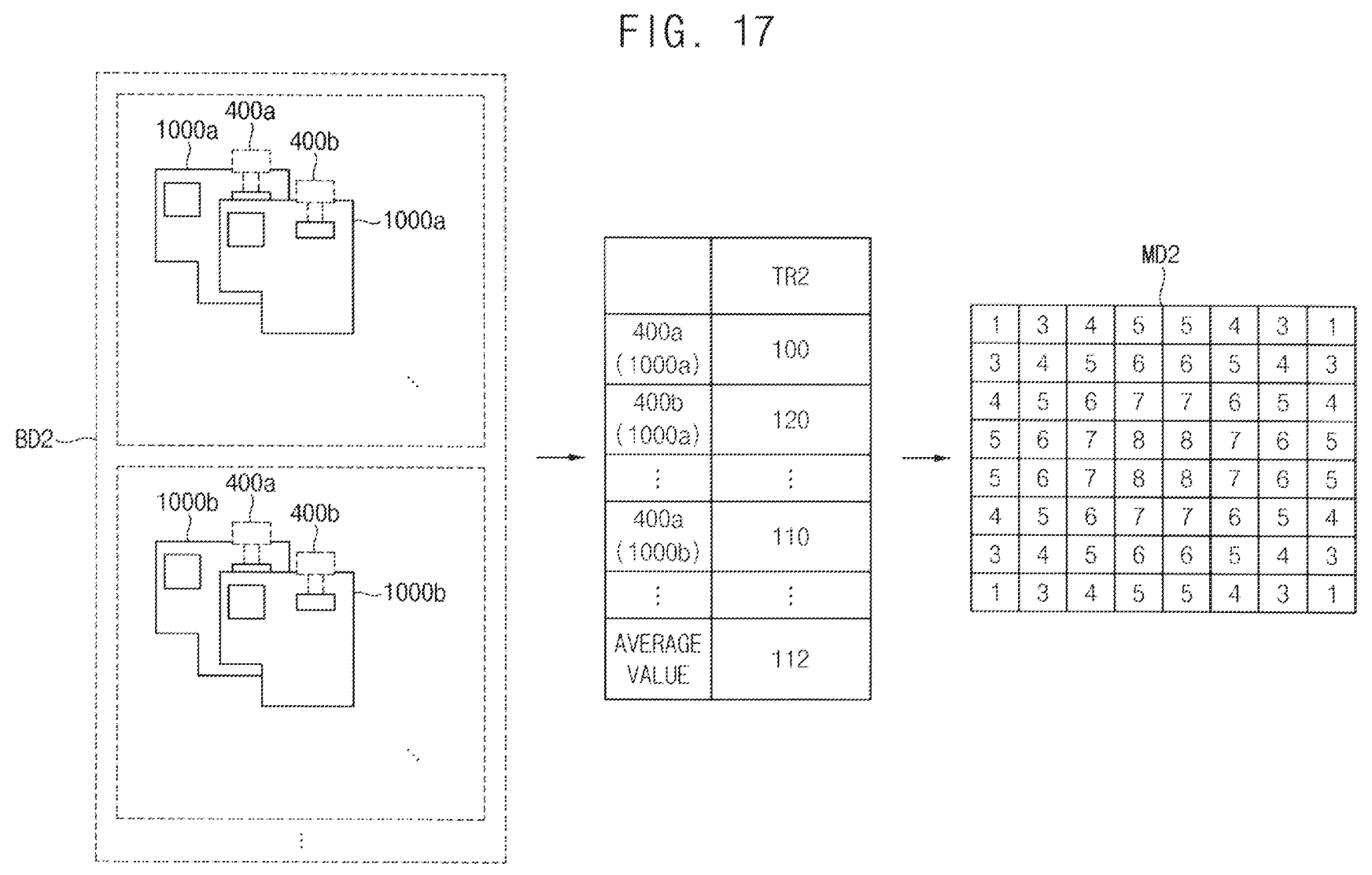

| | TR2 |
|---|---|
| 400a (1000a) | 100 |
| 400b (1000a) | 120 |
| ... | ... |
| 400a (1000b) | 110 |
| ... | ... |
| AVERAGE VALUE | 112 |

MD2

| 1 | 3 | 4 | 5 | 5 | 4 | 3 | 1 |
|---|---|---|---|---|---|---|---|
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

| 1 | 3 | 4 | 5 | 5 | 4 | 3 | 1 |
|---|---|---|---|---|---|---|---|
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

FIG. 20

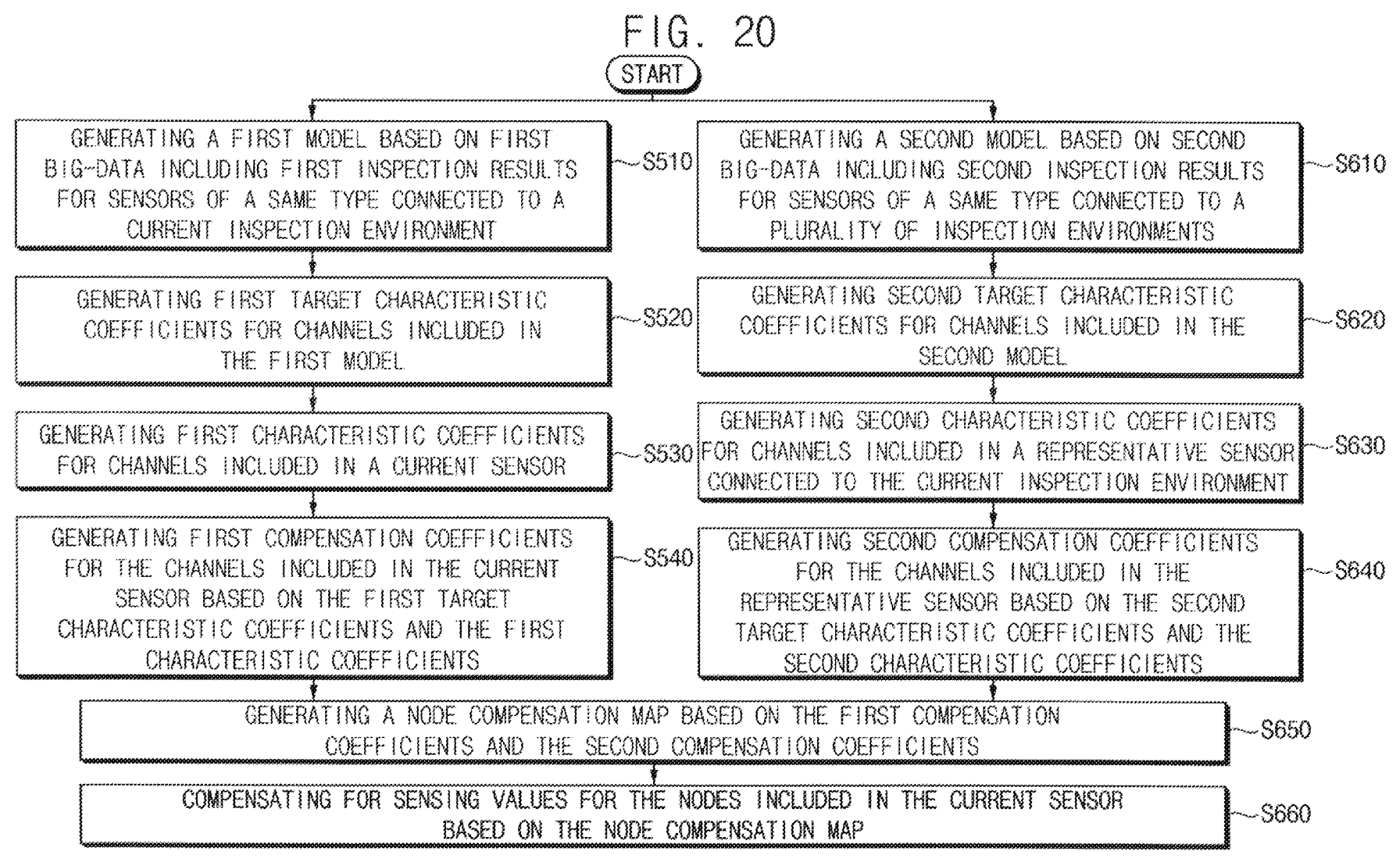

START

S510 — GENERATING A FIRST MODEL BASED ON FIRST BIG-DATA INCLUDING FIRST INSPECTION RESULTS FOR SENSORS OF A SAME TYPE CONNECTED TO A CURRENT INSPECTION ENVIRONMENT

S610 — GENERATING A SECOND MODEL BASED ON SECOND BIG-DATA INCLUDING SECOND INSPECTION RESULTS FOR SENSORS OF A SAME TYPE CONNECTED TO A PLURALITY OF INSPECTION ENVIRONMENTS

S520 — GENERATING FIRST TARGET CHARACTERISTIC COEFFICIENTS FOR CHANNELS INCLUDED IN THE FIRST MODEL

S620 — GENERATING SECOND TARGET CHARACTERISTIC COEFFICIENTS FOR CHANNELS INCLUDED IN THE SECOND MODEL

S530 — GENERATING FIRST CHARACTERISTIC COEFFICIENTS FOR CHANNELS INCLUDED IN A CURRENT SENSOR

S630 — GENERATING SECOND CHARACTERISTIC COEFFICIENTS FOR CHANNELS INCLUDED IN A REPRESENTATIVE SENSOR CONNECTED TO THE CURRENT INSPECTION ENVIRONMENT

S540 — GENERATING FIRST COMPENSATION COEFFICIENTS FOR THE CHANNELS INCLUDED IN THE CURRENT SENSOR BASED ON THE FIRST TARGET CHARACTERISTIC COEFFICIENTS AND THE FIRST CHARACTERISTIC COEFFICIENTS

S640 — GENERATING SECOND COMPENSATION COEFFICIENTS FOR THE CHANNELS INCLUDED IN THE REPRESENTATIVE SENSOR BASED ON THE SECOND TARGET CHARACTERISTIC COEFFICIENTS AND THE SECOND CHARACTERISTIC COEFFICIENTS

S650 — GENERATING A NODE COMPENSATION MAP BASED ON THE FIRST COMPENSATION COEFFICIENTS AND THE SECOND COMPENSATION COEFFICIENTS

S660 — COMPENSATING FOR SENSING VALUES FOR THE NODES INCLUDED IN THE CURRENT SENSOR BASED ON THE NODE COMPENSATION MAP

| 1## | 2## | 3## | 4## | 5## | 6## | 7## | 8## |
|------|------|------|------|------|------|------|------|
| 9## | 10## | 11## | 12## | 13## | 14## | 15## | 16## |
| 17## | 18## | 19## | 20## | 21## | 22## | 23## | 24## |
| 25## | 26## | 27## | 28## | 29## | 30## | 31## | 32## |
| 33## | 34## | 35## | 36## | 37## | 38## | 39## | 40## |
| 41## | 42## | 43## | 44## | 45## | 46## | 47## | 48## |
| 49## | 50## | 51## | 52## | 53## | 54## | 55## | 56## |
| 57## | 58## | 59## | 60## | 61## | 62## | 63## | 64## |

FIG. 22

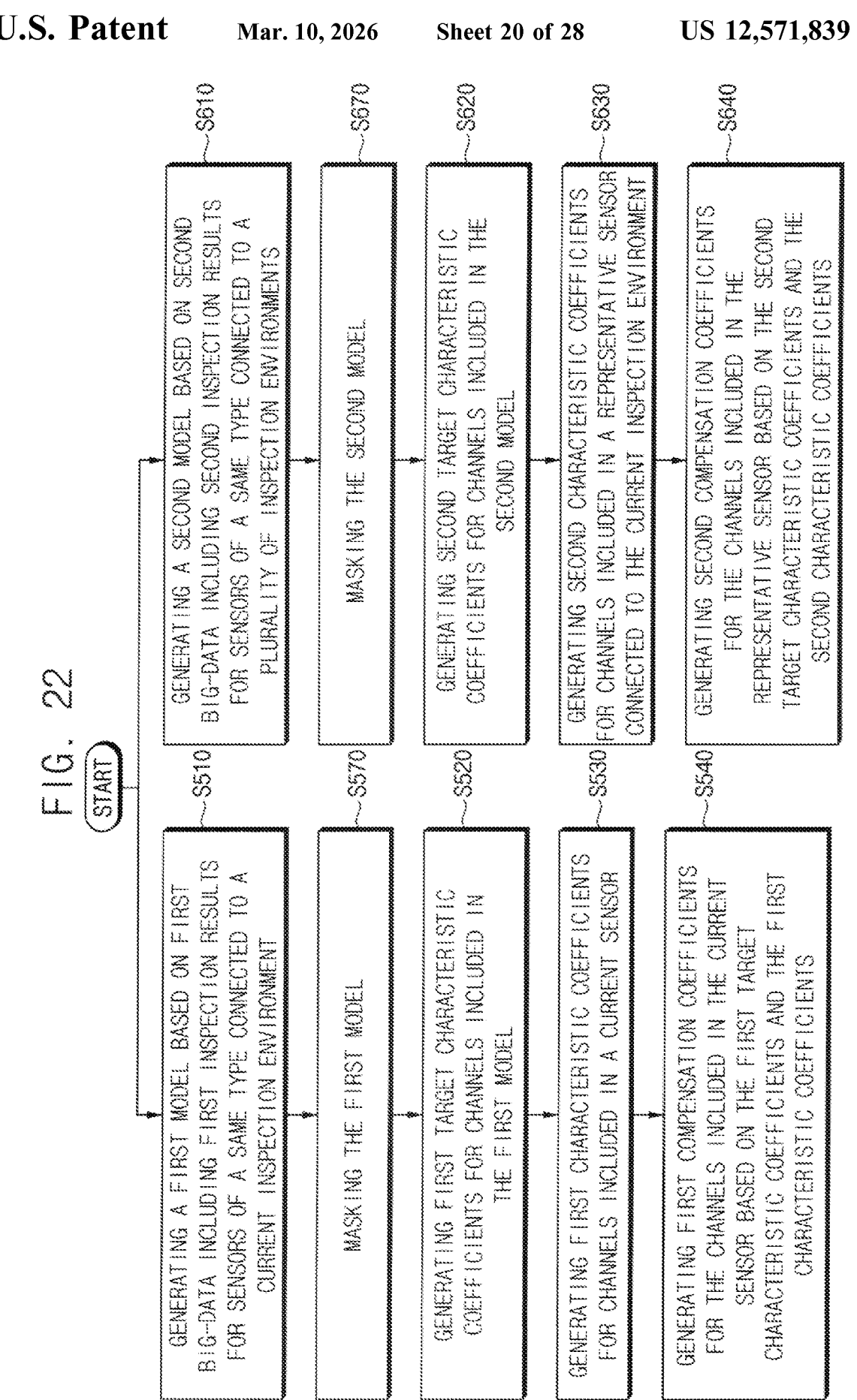

START

S510 GENERATING A FIRST MODEL BASED ON FIRST BIG-DATA INCLUDING FIRST INSPECTION RESULTS FOR SENSORS OF A SAME TYPE CONNECTED TO A CURRENT INSPECTION ENVIRONMENT

S570 MASKING THE FIRST MODEL

S520 GENERATING FIRST TARGET CHARACTERISTIC COEFFICIENTS FOR CHANNELS INCLUDED IN THE FIRST MODEL

S530 GENERATING FIRST CHARACTERISTIC COEFFICIENTS FOR CHANNELS INCLUDED IN A CURRENT SENSOR

S540 GENERATING FIRST COMPENSATION COEFFICIENTS FOR THE CHANNELS INCLUDED IN THE CURRENT SENSOR BASED ON THE FIRST TARGET CHARACTERISTIC COEFFICIENTS AND THE FIRST CHARACTERISTIC COEFFICIENTS

S610 GENERATING A SECOND MODEL BASED ON SECOND BIG-DATA INCLUDING SECOND INSPECTION RESULTS FOR SENSORS OF A SAME TYPE CONNECTED TO A PLURALITY OF INSPECTION ENVIRONMENTS

S570 MASKING THE SECOND MODEL

S620 GENERATING SECOND TARGET CHARACTERISTIC COEFFICIENTS FOR CHANNELS INCLUDED IN THE SECOND MODEL

S630 GENERATING SECOND CHARACTERISTIC COEFFICIENTS FOR CHANNELS INCLUDED IN A REPRESENTATIVE SENSOR CONNECTED TO THE CURRENT INSPECTION ENVIRONMENT

S640 GENERATING SECOND COMPENSATION COEFFICIENTS FOR THE CHANNELS INCLUDED IN THE REPRESENTATIVE SENSOR BASED ON THE SECOND TARGET CHARACTERISTIC COEFFICIENTS AND THE SECOND CHARACTERISTIC COEFFICIENTS

FIG. 25

|  | FIRST NODE | SECOND NODE | ... | SIXTY-THIRD NODE | SIXTY-FOURTH NODE |
|---|---|---|---|---|---|
| SV1 | 1 | 2 | | 3 | 1 |
| SV2 | 1 | 3 | | 2 | 1 |
| SV3 | 1 | 4 | | 4 | 1 |
| SV4 | 2 | 2 | ... | 2 | 2 |

MD1

| 1 | 3 | 4 | 5 | 5 | 4 | 3 | 1 |
|---|---|---|---|---|---|---|---|
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

FIG. 26

|  | FIRST NODE | SECOND NODE | | SIXTY-THIRD NODE | SIXTY-FOURTH NODE |
|---|---|---|---|---|---|
| SV1 | 1 | 2 | | 3 | 1 |
| SV2 | 1 | 3 | | 2 | 1 |
| SV3 | 1 | 4 | | 4 | 1 |
| SV4 | 2 | 2 | ⋯ | 2 | 2 |
| | | | | | |
| AVERAGE VALUE | 1 | 3 | | 3 | 1 |

MD1

| 1 | 3 | 4 | 5 | 5 | 4 | 3 | 1 |
|---|---|---|---|---|---|---|---|
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

FIG. 27

|  | FIRST NODE | SECOND NODE |  | SIXTY-THIRD NODE | SIXTY-FOURTH NODE |
|---|---|---|---|---|---|
| SV1 | 1 | 2 |  | 3 | 1 |
| SV2 | 1 | 3 |  | 2 | 1 |
| SV3 | 1 | 4 |  | 4 | 1 |
| SV3 | 2 | 2 | ⋮ | 2 | 2 |
|  |  |  |  |  |  |
| MEDIAN VALUE | 1 | 3 |  | 3 | 1 |

MD1

| 1 | 3 | 4 | 5 | 5 | 4 | 3 | 1 |
|---|---|---|---|---|---|---|---|
| 3 | 4 | 5 | 6 | 6 | 5 | 4 | 3 |
| 4 | 5 | 6 | 7 | 7 | 6 | 5 | 4 |
| 5 | 6 | 7 | 8 | 8 | 7 | 6 | 5 |
| 5 | 6 | 7 | 8 | 8 | 7 | 6 | 5 |
| 4 | 5 | 6 | 7 | 7 | 6 | 5 | 4 |
| 3 | 4 | 5 | 6 | 6 | 5 | 4 | 3 |
| 1 | 3 | 4 | 5 | 5 | 4 | 3 | 1 |

FIG. 28

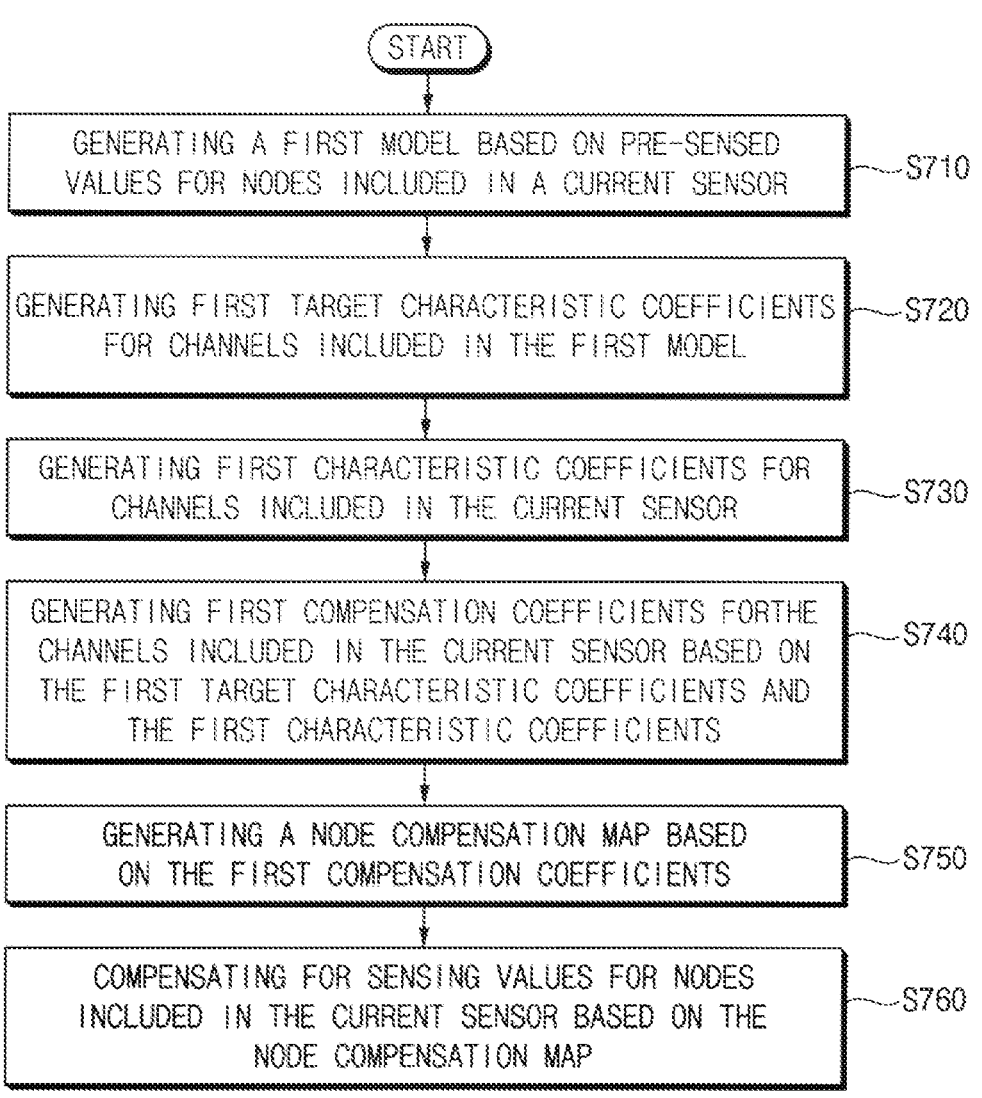

START

GENERATING A FIRST MODEL BASED ON PRE-SENSED VALUES FOR NODES INCLUDED IN A CURRENT SENSOR — S710

GENERATING FIRST TARGET CHARACTERISTIC COEFFICIENTS FOR CHANNELS INCLUDED IN THE FIRST MODEL — S720

GENERATING FIRST CHARACTERISTIC COEFFICIENTS FOR CHANNELS INCLUDED IN THE CURRENT SENSOR — S730

GENERATING FIRST COMPENSATION COEFFICIENTS FORTHE CHANNELS INCLUDED IN THE CURRENT SENSOR BASED ON THE FIRST TARGET CHARACTERISTIC COEFFICIENTS AND THE FIRST CHARACTERISTIC COEFFICIENTS — S740

GENERATING A NODE COMPENSATION MAP BASED ON THE FIRST COMPENSATION COEFFICIENTS — S750

COMPENSATING FOR SENSING VALUES FOR NODES INCLUDED IN THE CURRENT SENSOR BASED ON THE NODE COMPENSATION MAP — S760

FIG. 30

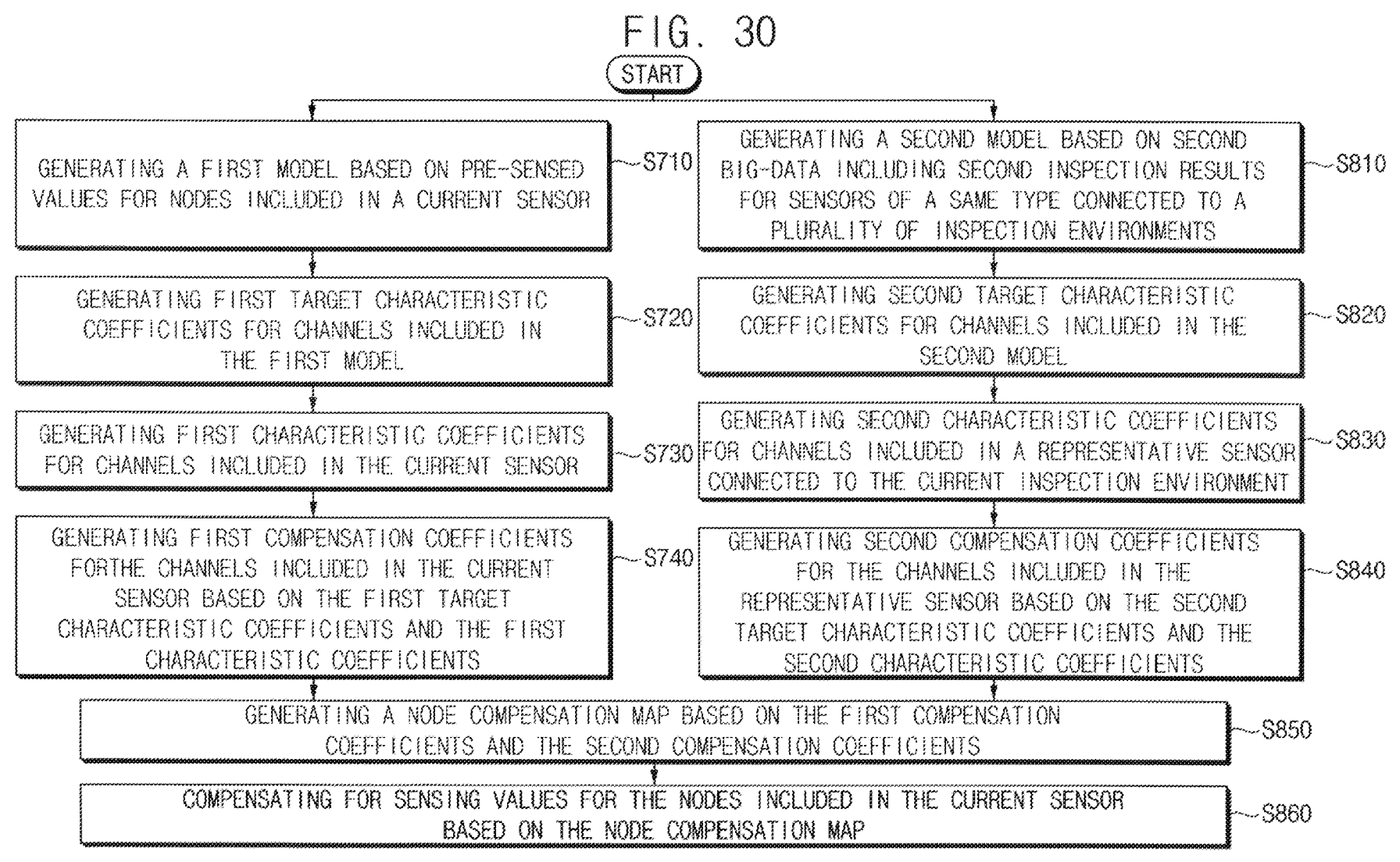

START

S710 — GENERATING A FIRST MODEL BASED ON PRE-SENSED VALUES FOR NODES INCLUDED IN A CURRENT SENSOR

S810 — GENERATING A SECOND MODEL BASED ON SECOND BIG-DATA INCLUDING SECOND INSPECTION RESULTS FOR SENSORS OF A SAME TYPE CONNECTED TO A PLURALITY OF INSPECTION ENVIRONMENTS

S720 — GENERATING FIRST TARGET CHARACTERISTIC COEFFICIENTS FOR CHANNELS INCLUDED IN THE FIRST MODEL

S820 — GENERATING SECOND TARGET CHARACTERISTIC COEFFICIENTS FOR CHANNELS INCLUDED IN THE SECOND MODEL

S730 — GENERATING FIRST CHARACTERISTIC COEFFICIENTS FOR CHANNELS INCLUDED IN THE CURRENT SENSOR

S830 — GENERATING SECOND CHARACTERISTIC COEFFICIENTS FOR CHANNELS INCLUDED IN A REPRESENTATIVE SENSOR CONNECTED TO THE CURRENT INSPECTION ENVIRONMENT

S740 — GENERATING FIRST COMPENSATION COEFFICIENTS FORTHE CHANNELS INCLUDED IN THE CURRENT SENSOR BASED ON THE FIRST TARGET CHARACTERISTIC COEFFICIENTS AND THE FIRST CHARACTERISTIC COEFFICIENTS

S840 — GENERATING SECOND COMPENSATION COEFFICIENTS FOR THE CHANNELS INCLUDED IN THE REPRESENTATIVE SENSOR BASED ON THE SECOND TARGET CHARACTERISTIC COEFFICIENTS AND THE SECOND CHARACTERISTIC COEFFICIENTS

S850 — GENERATING A NODE COMPENSATION MAP BASED ON THE FIRST COMPENSATION COEFFICIENTS AND THE SECOND COMPENSATION COEFFICIENTS

S860 — COMPENSATING FOR SENSING VALUES FOR THE NODES INCLUDED IN THE CURRENT SENSOR BASED ON THE NODE COMPENSATION MAP

METHOD OF INSPECTING A SENSOR

CROSS REFERENCE TO RELATED APPLICATION

This application claims priority from and the benefit of Korean Patent Application No. 10-2021-0104774, filed on Aug. 9, 2021, which is hereby incorporated by reference for all purposes as if fully set forth herein.

BACKGROUND

Field

Embodiments of the inventive concept relate generally to a method of inspecting a sensor. More particularly, embodiments of the inventive concept relate to a method of inspecting a sensor for compensating for a connection deviation and an inspection environment deviation

Discussion of the Background

Sensors and sensor ICs (Integrated Circuit) may be included in various electric apparatuses, such as a smartphone and a tablet PC (Personal Computer). A recent electric apparatus may include the sensors and the sensor ICs so that a command issued by a user is input through a human finger or other contact means. Each of the sensors may be mechanically connected to the inspection environment in order to inspect defects of the sensors. In inspecting the sensors, false positives may be caused due to deviations according to the inspection environment and the mechanical connection.

The above information disclosed in this Background section is only for understanding of the background of the inventive concepts, and, therefore, it may contain information that does not constitute prior art.

SUMMARY

Embodiments of the inventive concept provide a method of inspecting a sensor compensating for a connection deviation.

Embodiments of the inventive concept provide a method of inspecting a sensor compensating for an inspection environment deviation.

Additional features of the inventive concept will be set forth in the description which follows, and in part will be apparent from the description, or may be learned by practice of the inventive concepts.

An embodiment of the inventive concept provides a method of inspecting a sensor including generating a first model based on first big-data including first inspection results for sensors of a same type connected to a current inspection environment, generating first target characteristic coefficients for channels included in the first model, generating first characteristic coefficients for channels included in a current sensor, and generating first compensation coefficients for the channels included in the current sensor based on the first target characteristic coefficients and the first characteristic coefficients.

The method may further include masking the first model.

The method may further include generating a node compensation map based on the first compensation coefficients, and compensating for sensing values for nodes included in the current sensor based on the node compensation map.

The node compensation map may be generated based on the first compensation coefficients and a size of each of the nodes included in the current sensor.

The first model may be generated based on average values of the respective first inspection results for nodes included in the sensors of the same type connected to the current inspection environment.

The first model may be generated based on median values of the respective first inspection results for nodes included in the sensors of the same type connected to the current inspection environment.

The method may further include generating a second model based on second big-data including second inspection results for sensors of a same type connected to a plurality of inspection environments, generating second target characteristic coefficients for channels included in the second model, generating second characteristic coefficients for channels included in a representative sensor connected to the current inspection environment, and generating second compensation coefficients for the channels included in the representative sensor based on the second target characteristic coefficients and the second characteristic coefficients.

The method may further include masking the first model and the second model.

The method may further include generating a node compensation map based on the first compensation coefficients and the second compensation coefficients, and compensating for sensing values for the nodes included in the current sensor based on the node compensation map.

The node compensation map may be generated based on the first compensation coefficients, the second compensation coefficients, and a size of each of the nodes included in the current sensor.

The first model may be generated based on average values of the respective first inspection results for nodes included in the sensors of the same type connected to the current inspection environment. The second model may be generated based on average values of the respective second inspection results for nodes included in the sensors of the same type connected to the plurality of the inspection environments.

The first model may be generated based on median values of the respective first inspection results for nodes included in the sensors of the same type connected to the current inspection environment. The second model may be generated based on median values of the respective second inspection results for nodes included in the sensors of the same type connected to the plurality of the inspection environments.

Another embodiment of the inventive concept provides a method of inspecting a sensor including generating a first model based on pre-sensed values for nodes included in a current sensor, generating first target characteristic coefficients for channels included in the first model, generating first characteristic coefficients for channels included in the current sensor, and generating first compensation coefficients for the channels included in the current sensor based on the first target characteristic coefficients and the first characteristic coefficients.

The method may further include masking the first model.

The method may further include generating a node compensation map based on the first compensation coefficients, and compensating for sensing values for the nodes included in the current sensor based on the node compensation map.

The node compensation map may be generated based on the first compensation coefficients and a size of each of the nodes included in the current sensor.

The first model may be generated based on average values of the respective pre-sensed values for the nodes included in the current sensor.

The first model may be generated based on median values of the respective pre-sensed values for the nodes included in the current sensor.

The method may further include generating a second model based on second big-data including second inspection results for sensors of a same type connected to a plurality of inspection environments, generating second target characteristic coefficients for channels included in the second model, generating second characteristic coefficients for channels included in a representative sensor connected to the current inspection environment, and generating second compensation coefficients for the channels included in the representative sensor based on the second target characteristic coefficients and the second characteristic coefficients.

The method may further include generating a node compensation map based on the first compensation coefficients and the second compensation coefficients, and compensating for sensing values for the nodes included in the current sensor based on the node compensation map.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concept.

FIG. 2 is a block diagram for explaining a sensor.

FIGS. 5, 6, and 7 are diagrams illustrating an example of generating of a first model performed by the method of FIG. 4.

FIG. 15 is a flowchart illustrating a method of inspecting a sensor according to embodiments of the inventive concept.

FIGS. 16, 17, and 18 are diagrams illustrating an example of generating of a second model performed by the method of FIG. 15.

FIG. 20 is a flowchart illustrating a method of inspecting a sensor according to embodiments of the inventive concept.

FIG. 21 is a diagram illustrating an example of generating a node compensation map performed by the method of FIG. 20.

FIG. 22 is a flowchart illustrating a method of inspecting a sensor according to embodiments of the inventive concept.

FIGS. 25, 26, and 27 are diagrams illustrating an example of generating of a first model performed by the method of FIG. 24.

FIG. 28 is a flowchart illustrating a method of inspecting a sensor according to embodiments of the inventive concept.

FIG. 30 is a flowchart illustrating a method of inspecting a sensor according to embodiments of the inventive concept.

DETAILED DESCRIPTION OF THE INVENTIVE CONCEPT

Figure 1:
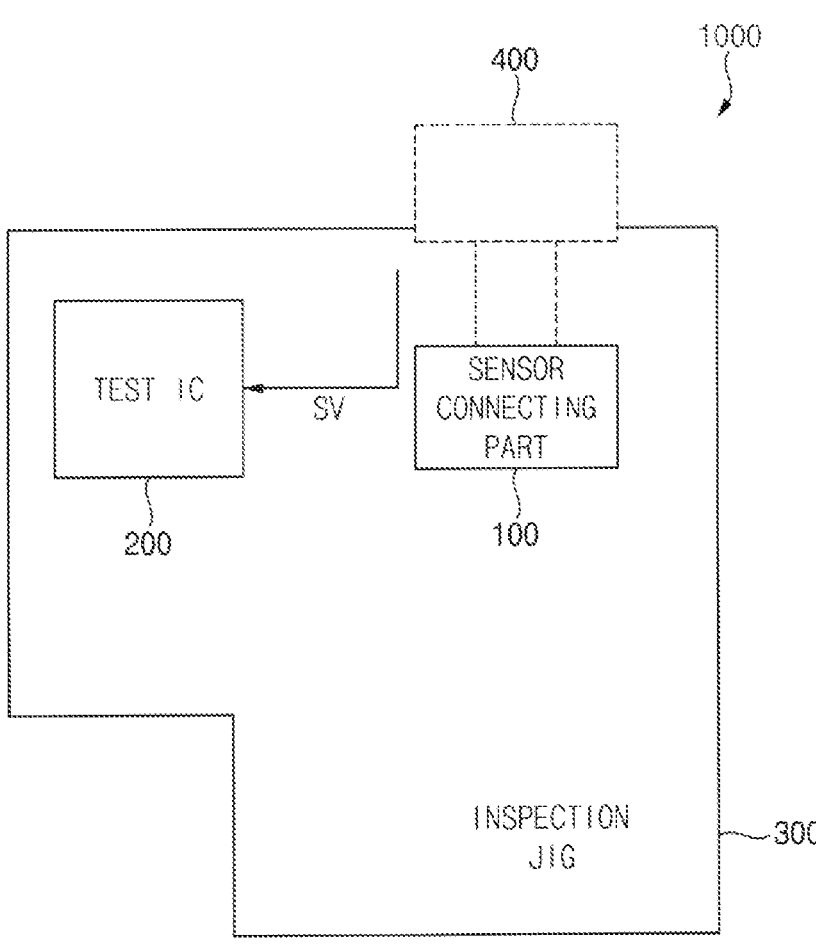
FIG. 1 is a block diagram for explaining an inspection environment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concept will be explained in detail with reference to the accompanying drawings.

FIG. 1 is a block diagram for explaining an inspection environment 1000, and FIG. 2 is a block diagram for explaining a sensor 400.

Referring to FIG. 1, the inspection environment 1000 may include a sensor connecting part 100, a test IC 200, and an inspection jig 300.

In the sensor connecting part 100, the inspection jig 300 may be connected to the sensor 400.

The test IC 200 may receive sensing values SV from the sensor 400 through the inspection jig 300. According to an embodiment, the test IC 200 may receive the sensing values SV and convert the sensing values having an analog type into a digital type. The test IC 200 may be an IC temporarily used to inspect defects of the sensor 400. For example, the test IC 200 may be the same as an IC in a driving environment of the sensor 400 (i.e., the sensor 400 may be connected to the driving environment when the sensor 400 is actually used).

The inspection jig 300 may connect the test IC 200 and the sensor 400 to send and receive signals.

Referring to FIG. 2, the sensor 400 may include channels Tx and Rx. According to an embodiment, the sensor 400 may include transmission channels (Tx1, Tx2, . . . , Tx8; Tx) and reception channels (Rx1, Rx2, . . . , Rx8; Rx). For example, the transmission channels (Tx1, Tx2, . . . , Tx8; Tx) may extend in the first direction D1, and the reception channels (Rx1, Rx2, . . . , Rx8; Rx) may extend in a second direction D2 crossing the first direction D1. For example, the test IC 200 may apply a specific signal to the transmission channels (Tx1, Tx2, . . . , Tx8; Tx), and receive the sensing values SV from the reception channels (Rx1, Rx2, . . . , Rx8; Rx). The sensor 400 may include a plurality of nodes N. The sensor 400 may output the sensing values SV for nodes N. For example, the nodes N may exist at an intersection of the transmit channels (Tx1, Tx2, . . . , Tx8; Tx) and the reception channels (Rx1, Rx2, . . . , Rx8; Rx). For example, the test IC 200 may sequentially apply a specific signal to the transmission channels (Tx1, Tx2, . . . , Tx8; Tx) and receive the sensing values SV for nodes N from the reception channels (Rx1, Rx2, . . . , Rx8; Rx).

Figure 3:
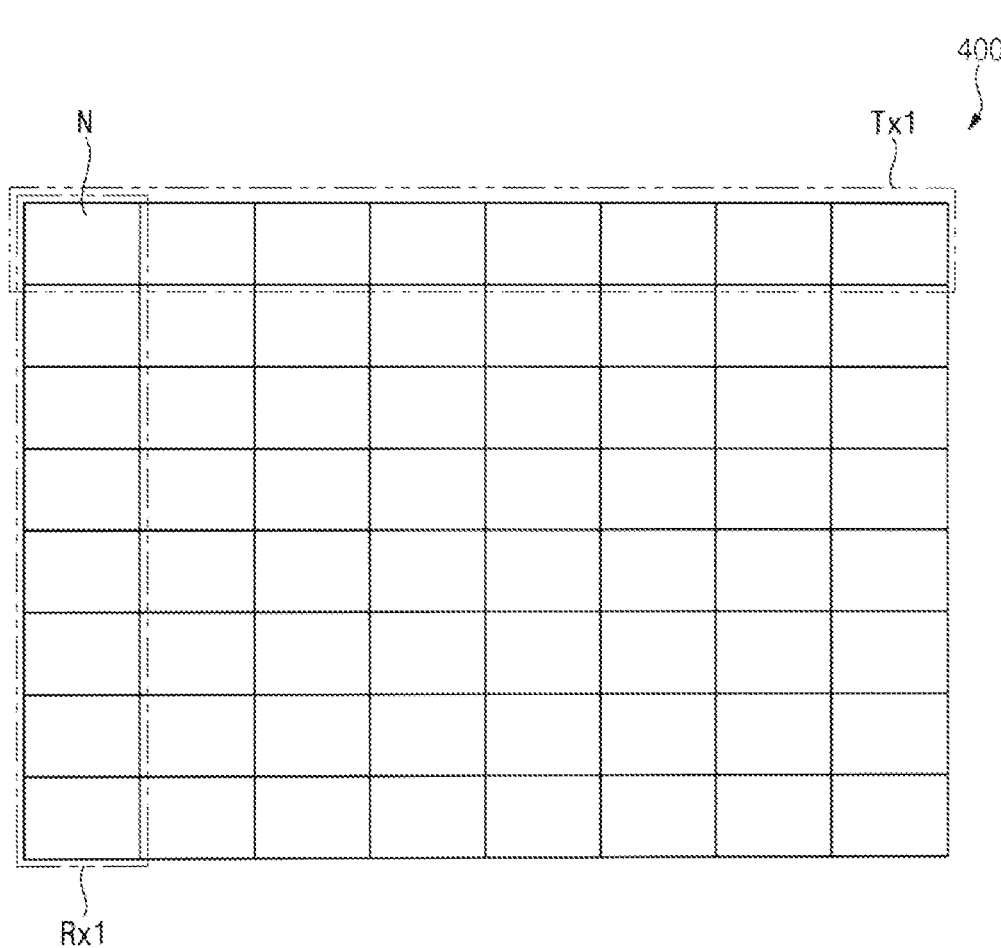
FIG. 3 is a diagram illustrating an example of a simplified sensor of FIG. 2.

FIG. 3 is a diagram illustrating an example of a simplified sensor 400 of FIG. 2.

Referring to FIG. 3, each of squares of FIG. 3 represents a node N, a horizontal line represents the transmission channel (Tx1, Tx2, . . . , Tx8; Tx), and a vertical line represents the reception channel (Rx1, Rx2, . . . , Rx8; Rx). The drawings below show the sensor 400 in the form of FIG. 3.

Figure 4:
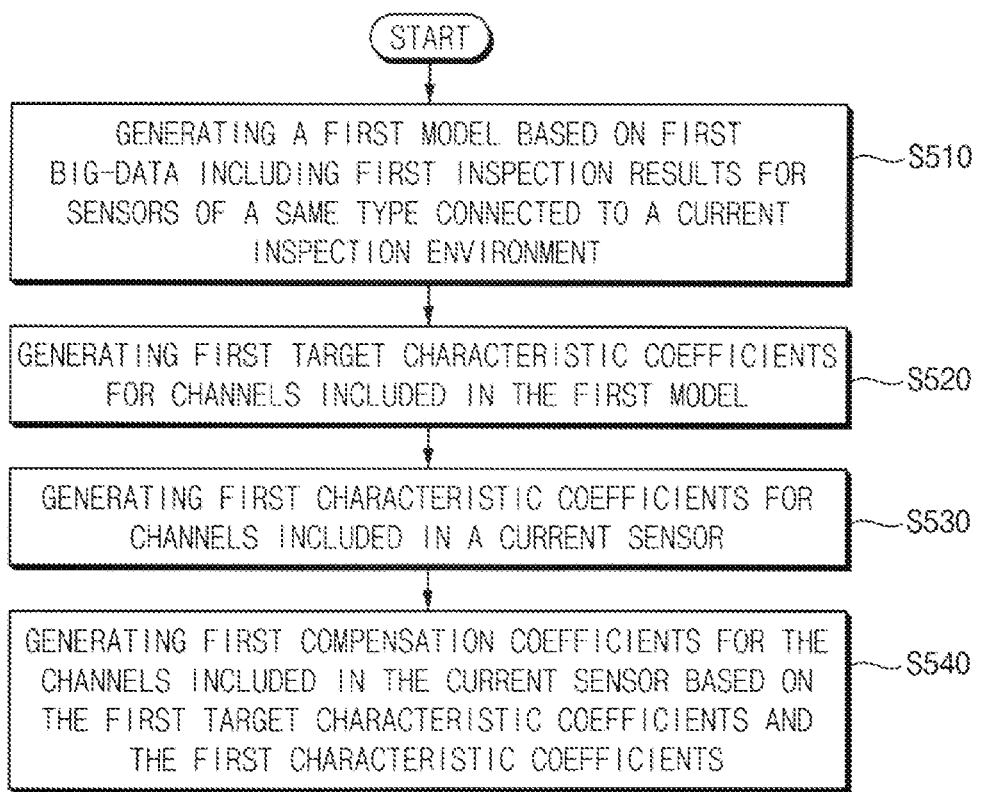
FIG. 4 is a flowchart illustrating a method of inspecting a sensor according to embodiments of the inventive concept.
Figure 5:
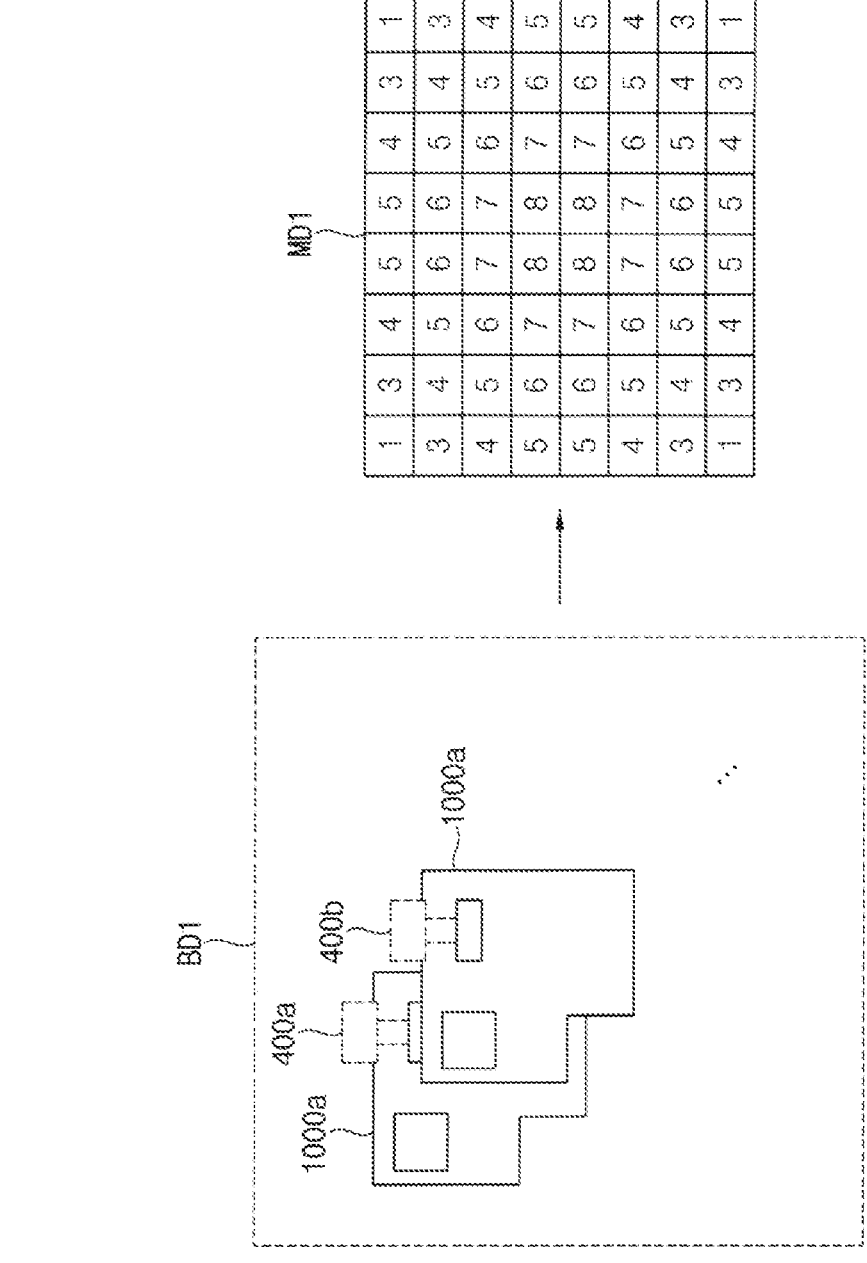
Figure 7:
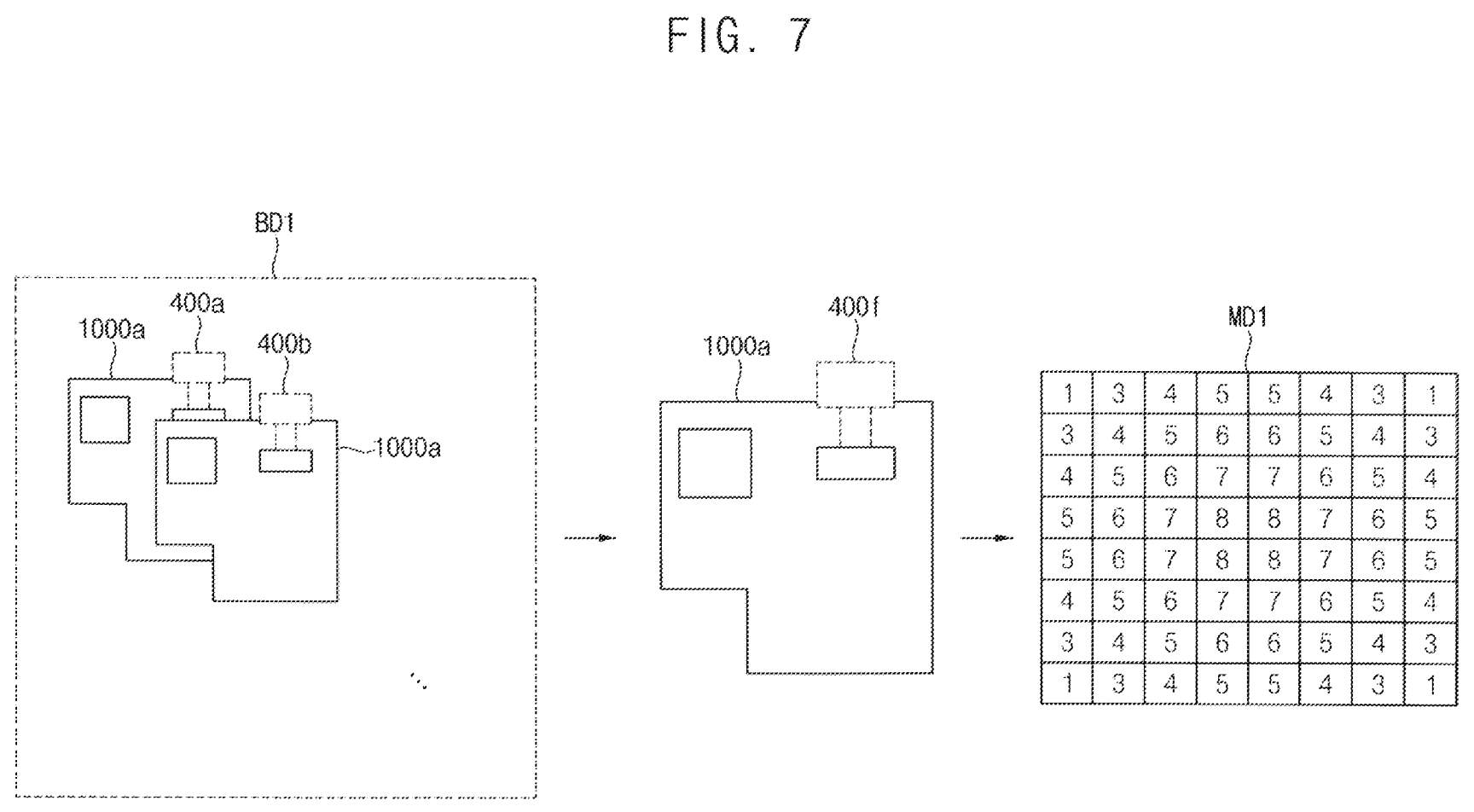
Figure 8:
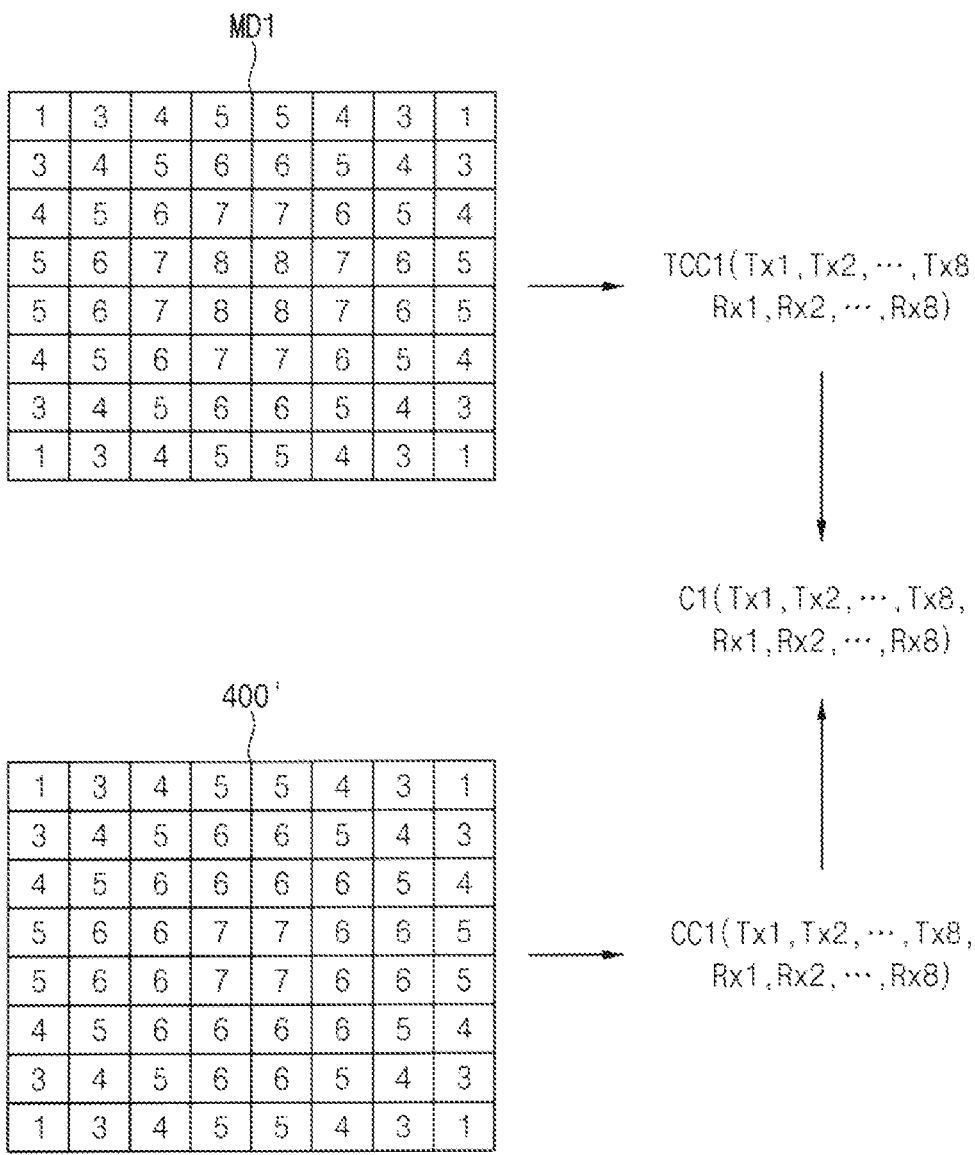
FIG. 8 is a diagram illustrating an example of generating of first compensation coefficients performed by the method of FIG. 4.

FIG. 4 is a flowchart illustrating a method of inspecting a sensor according to embodiments of the inventive concept. FIGS. 5 to 7 are diagrams illustrating an example of generating of a first model performed by the method of FIG. 4. FIG. 8 is a diagram illustrating an example of generating of first compensation coefficients C1(Tx1, Tx2, . . . , Tx8, Rx1, Rx2, . . . , Rx8) performed by the method of FIG. 4. In FIGS. 5 to 8, numbers displayed on nodes included in a first model MD1 and a current sensor 400' is an example of the sensing values SV for the nodes. The current sensor 400' means the sensor 400 currently being inspected. First inspection results TR1 of FIG. 6 are an example. For example, in FIGS. 5 to 8, the numbers displayed on nodes included in the first model MD1 and the current sensor 400' is the sensing values SV for the nodes according to a specific touch.

Referring to FIGS. 1 to 8, the method of FIG. 4 may generate the first model MD1 based on first big-data BD1 including the first inspection results TR1 for sensors (400a, 400b, . . . ) of a same type connected to a current inspection environment 1000a (S510), generate first target characteristic coefficients TCC1(Tx1, Tx2, . . . , Tx8, Rx1, Rx2, . . . , Rx8) for channels included in the first model MD1 (S520), generate first characteristic coefficients CC1(Tx1, Tx2, . . . , Tx8, Rx1, Rx2, . . . , Rx8) for channels included in a current sensor 400' (S530), and generate first compensation coefficients C1(Tx1, Tx2, . . . , Tx8, Rx1, Rx2, . . . , Rx8) for the channels included in the current sensor 400' based on the first target characteristic coefficients TCC1 (Tx1, Tx2, . . . , Tx8, Rx1, Rx2, . . . , Rx8) and the first characteristic coefficients CC1(Tx1, Tx2, . . . , Tx8, Rx1, Rx2, . . . , Rx8) (S540).

Specifically, the method of FIG. 4 may generate the first model MD1 based on the first big-data BD1 including the first inspection results TR1 for the sensors (400a, 400b, . . . ) of the same type connected to the current inspection environment 1000a (S510). The current inspection environment 1000a means the same inspection environment as the inspection environment in which the first characteristic coefficients CC1(Tx1, Tx2, . . . , Tx8, Rx1, Rx2, Rx8) are generated. For example, the current inspection environment 1000a may include the test IC and the inspection jig same as used to generate the first characteristic coefficients CC1(Tx1, Tx2, . . . , Tx8, Rx1, Rx2, . . . , Rx8). The sensors (400a, 400b, . . . ) of the same type may also include the current sensor 400'. The first inspection results TR1 may be a resistor, a capacitor, or the like of the sensor.

The first model MD1 may be a representative model for compensating for a deviation when the deviation occurs between the sensors (400a, 400b, . . . ) of the same type connected to the current inspection environment 1000a in the first inspection results TR1 due to an external factor such as a connection deviation.

According to an embodiment, the first model MD1 may be generated based on average values of the respective first inspection results TR1 for nodes included in the sensors (400a, 400b, . . . ) of the same type connected to the current inspection environment 1000a (i.e., the average values of the respective first inspection results TR1 for nodes at the same location). For example, in the first model MD1, the average values of the respective first inspection results TR1 for nodes included in the sensors (400a, 400b, . . . ) may be generated as inspection results. For example, the first model MD1 may include characteristics of a sensor corresponding to the average values. For example, the first model MD1 may include information on the sensing values SV of the sensor corresponding to the average values according to an arbitrary touch.

According to an embodiment, the first model MD1 may be generated based on median values of the respective first inspection results TR1 for nodes included in the sensors (400a, 400b, . . . ) of the same type connected to the current inspection environment 1000a (i.e., the median values of the respective first inspection results TR1 for nodes at the same location). For example, when the first inspection result TR1 of a specific sensor 400f is the mediate values of the first inspection results TR1, the first model MD1 may include characteristic of the specific sensor 400f. For example, the first model MD1 may include information on the sensing values SV of a sensor corresponding to the median values (i.e., the specific sensor 400f) according to an arbitrary touch.

When the sensor 400 is connected to the sensor connecting part 100, the connection deviation may occur. The connection deviation means a deviation in contact resistance when the sensor 400 is connected to the sensor connecting part 100. Accordingly, when the inspection is repeated in the same sensor 400 and the same inspection environment 1000, the inspection results may be different due to the connection deviation. Also, due to the connection deviation, the sensing values SV in the specific channel Tx and Rx or the specific node N may be abnormally high or low. The method of FIG. 4 generates the first model MD1 based on numerous inspection results, so that an influence of the connection deviation on the generating of the first model MD1 may be reduced.

Specifically, the method of FIG. 4 may generate the first target characteristic coefficients TCC1(Tx1, Tx2, . . . , Tx8, Rx1, Rx2, . . . , Rx8) for the channels included in the first model MD1 (S520), generate first characteristic coefficients CC1(Tx1, Tx2, . . . , Tx8, Rx1, Rx2, . . . , Rx8) for channels included in a current sensor 400' (S530), and generate first compensation coefficients C1(Tx1, Tx2, . . . , Tx8, Rx1, Rx2, . . . , Rx8) for the channels included in the current sensor 400' based on the first target characteristic coefficients TCC1(Tx1, Tx2, . . . , Tx8, Rx1, Rx2, . . . , Rx8) and the first characteristic coefficients CC1(Tx1, Tx2, . . . , Tx8, Rx1, Rx2, . . . , Rx8) (S540). Characteristic coefficients may represent an effect of the channels Tx and Rx on the sensing values SV. For example, the characteristic coefficients may represent an effect of the channels Tx and Rx on the sensing value SV when a touch is applied to the sensor 400. The method of FIG. 4 may compensate for a difference between the first characteristic coefficients CC1(Tx1, Tx2, . . . , Tx8, Rx1, Rx2, . . . , Rx8) and the first target characteristic coefficients TCC1(Tx1, Tx2, . . . , Tx8), so that the deviation
of the inspection results caused by the connection deviation
or the non-ideal sensing value SV of a specific channel may
be compensated. As a result, the method of FIG. 4 may
prevent false positives caused by the connection deviation
and a productivity of the sensor 400 may be increased.

Figure 9:
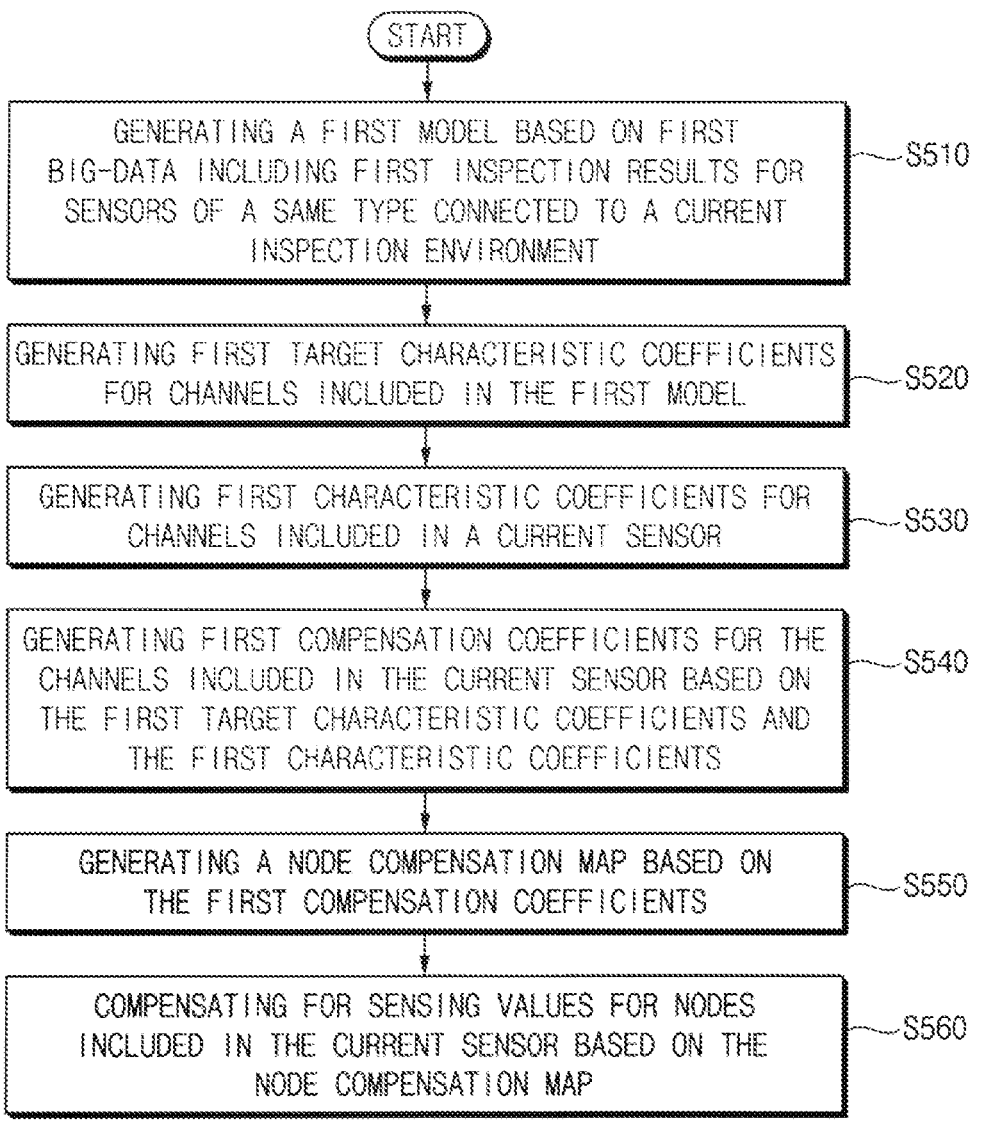
FIG. 9 is a flowchart illustrating a method of inspecting a sensor according to embodiments of the inventive concept.
Figures 10, 11:
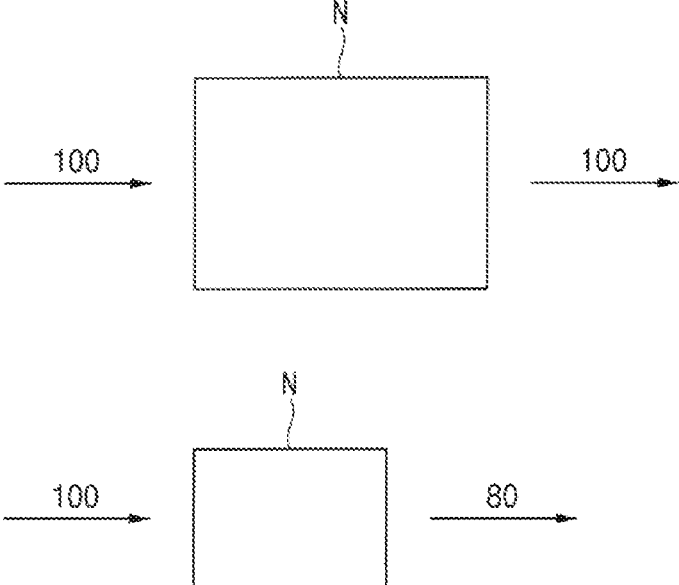
FIG. 10 is a diagram illustrating an example of generating a node compensation map performed by the method of FIG. 9.
FIG. 11 is a diagram illustrating an example of a change in sensing values according to a size of each of nodes according to embodiments of the inventive concept.

FIG. 9 is a flowchart illustrating a method of inspecting a
sensor according to embodiments of the inventive concept.
FIG. 10 is a diagram illustrating an example of generating a
node compensation map NM performed by the method of
FIG. 9. FIG. 11 is a diagram illustrating an example of a
change in sensing values SV according to a size of each of
the nodes N according to embodiments of the inventive
concept.

The method of inspecting the sensor according to the
present embodiment is substantially the same as the method
of FIG. 4 except for generating the node compensation map
NM. Thus, the same reference numerals are used to refer to
the same or similar element, and any repetitive explanation
will be omitted.

Referring to FIGS. 1 to 11, the method of FIG. 9 may
generate the first model MD1 based on the first big-data BD1
including the first inspection results TR1 for sensors (400*a*,
400*b*, . . . ) of the same type connected to the current
inspection environment 1000*a* (S510), generate first target
characteristic coefficients TCC1(Tx1, Tx2, . . . , Tx8, Rx1,
Rx2, . . . , Rx8) for the channels included in the first model
MD1 (S520), generate the first characteristic coefficients
CC1(Tx1, Tx2, . . . , Tx8, Rx1, Rx2, . . . , Rx8) for the
channels included in the current sensor 400' (S530), generate
the first compensation coefficients C1(Tx1, Tx2, . . . , Tx8,
Rx1, Rx2, . . . , Rx8) for the channels included in the current
sensor 400' based on the first target characteristic coeffi-
cients TCC1(Tx1, Tx2, . . . , Tx8, Rx1, Rx2, . . . , Rx8) and
the first characteristic coefficients CC1(Tx1, Tx2, . . . , Tx8,
Rx1, Rx2, . . . , Rx8) (S540), generate the node compensa-
tion map NM based on the first compensation coefficients
CC1(Tx1, Tx2, . . . , Tx8, Rx1, Rx2, . . . , Rx8) (S550), and
compensate for the sensing values SV for the nodes N
included in the current sensor 400' based on the node
compensation map NM (S560).

Specifically, the method of FIG. 9 may generate the node
compensation map NM based on the first compensation
coefficients CC1(Tx1, Tx2, . . . , Tx8, Rx1, Rx2, . . . , Rx8)
(S550). Since the nodes N exists at an intersection of the
transmit channels Tx and the reception channel Rx, the
sensing values SV for the nodes N may be affected by the
respective channels Tx and Rx. Accordingly, compensation
values (1 #, 2 #, . . . , 64 #) for the sensing values SV for
nodes N are determined through the first compensation
coefficients C1(Tx1, Tx2, . . . , Tx8, Rx1, Rx2, . . . , Rx8).
The method of FIG. 9 may compensate for the sensing
values SV for nodes N based on the compensation values
(1 #, 2 #, . . . , 64 #). As a result, the method of FIG. 9 may
facilitate compensation of the sensing value SV.

According to an embodiment, the node compensation
map NM may be generated based on the first compensation
coefficients C1(Tx1, Tx2, . . . , Tx8, Rx1, Rx2, . . . , Rx8)
and a size of the nodes N included in the current sensor 400'.
As the size of each of the nodes N included in the current
sensor 400' increases, the sensing values SV may increase
when the same input (e.g., the input may mean a touch) is
received. Conversely, as the size of each of the nodes N
included in the current sensor 400' decreases, the sensing
values SV may decrease when the same input is received.
Accordingly, by adjusting each of compensation values (1 #,
2 #, . . . , 64 #) according to the size of each of nodes N included in the current sensor 400', the sensing values SV
may be compensated more accurately.

Figure 12:
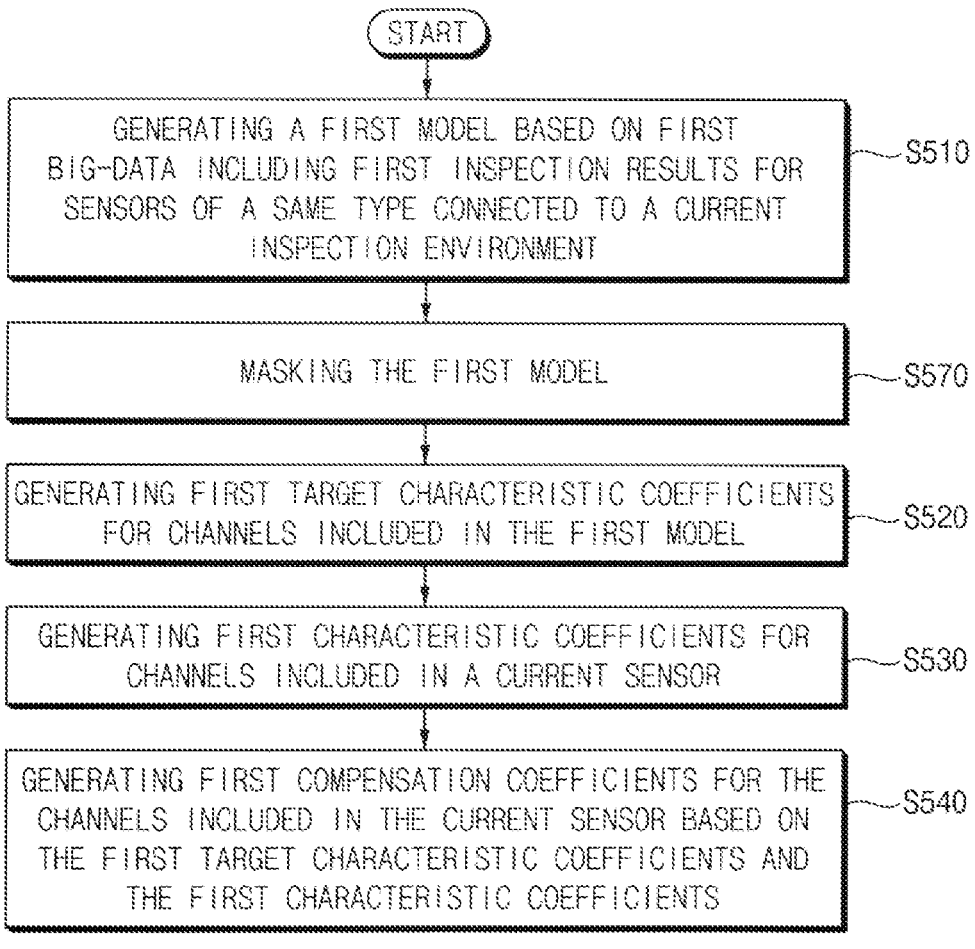
FIG. 12 is a flowchart illustrating a method of inspecting a sensor according to embodiments of the inventive concept.
Figure 13:
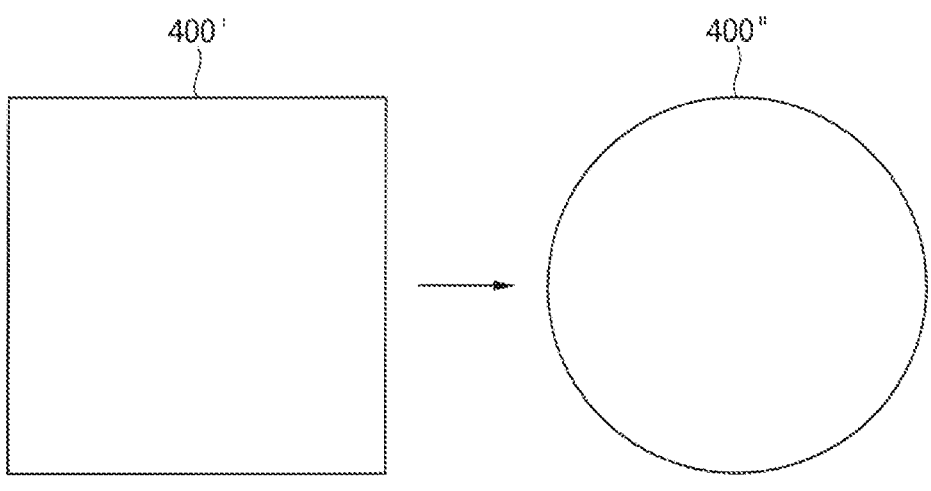
FIG. 13 is a diagram illustrating an example of a design of a sensor according to the method of FIG. 12.
Figure 14:
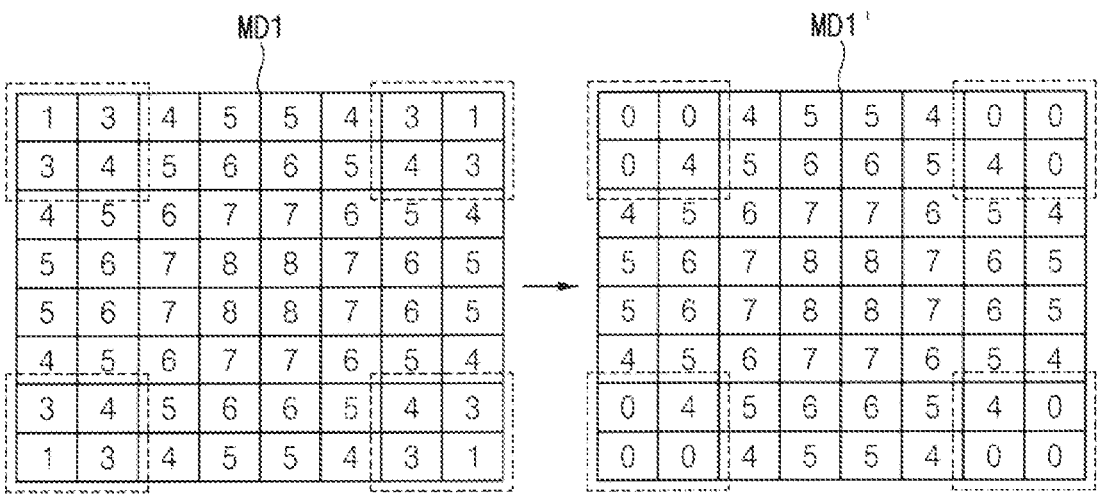
FIG. 14 is a diagram illustrating an example of masking performed by the method of FIG. 12.

FIG. 12 is a flowchart illustrating a method of inspecting
a sensor according to embodiments of the inventive concept.
FIG. 13 is a diagram illustrating an example of a design of
a sensor according to the method of FIG. 12. FIG. 14 is a
diagram illustrating an example of masking performed by
the method of FIG. 12.

The method of inspecting the sensor according to the
present embodiment is substantially the same as the method
of FIG. 4 except for masking the first model MD1. Thus, the
same reference numerals are used to refer to the same or
similar element, and any repetitive explanation will be
omitted.

Referring to FIGS. 1 to 8 and 12 to 14, the method of FIG.
12 may generate the first model MD1 based on the first
big-data BD1 including the first inspection results TR1 for
the sensors (400*a*, 400*b*, . . . ) of the same type connected to
the current inspection environment 1000*a* (S510), mask the
first model MD1 (S570), generate the first target character-
istic coefficients TCC1(Tx1, Tx2, . . . , Tx8, Rx1,
Rx2, . . . , Rx8) for the channels included in the first model
MD1 (S520), generate the first characteristic coefficients
CC1(Tx1, Tx2, . . . , Tx8, Rx1, Rx2, . . . , Rx8) for the
channels included in the current sensor 400' (S530), and
generate the first compensation coefficients C1(Tx1,
Tx2, . . . , Tx8, Rx1, Rx2, . . . , Rx8) for the channels
included in the current sensor 400' based on the first target
characteristic coefficients TCC1(Tx1, Tx2, . . . , Tx8, Rx1,
Rx2, . . . , Rx8) and the first characteristic coefficients
CC1(Tx1, Tx2, . . . , Tx8, Rx1, Rx2, . . . , Rx8) (S540).

Specifically, the method of FIG. 12 may mask the first
model MD1 (S570). For example, as shown in FIG. 13, the
current sensor 400' may be redesigned as a circular sensor
400" after inspection. In this case, the nodes of the corner
may be cut-off, and most of the cut-off nodes may not output
the sensing values SV. Accordingly, the first model MD1
may mask unnecessary corner nodes. As a result, the sensing
values SV output from the nodes of the corners of the
masked first model MD1' may be zero.

Figure 16:
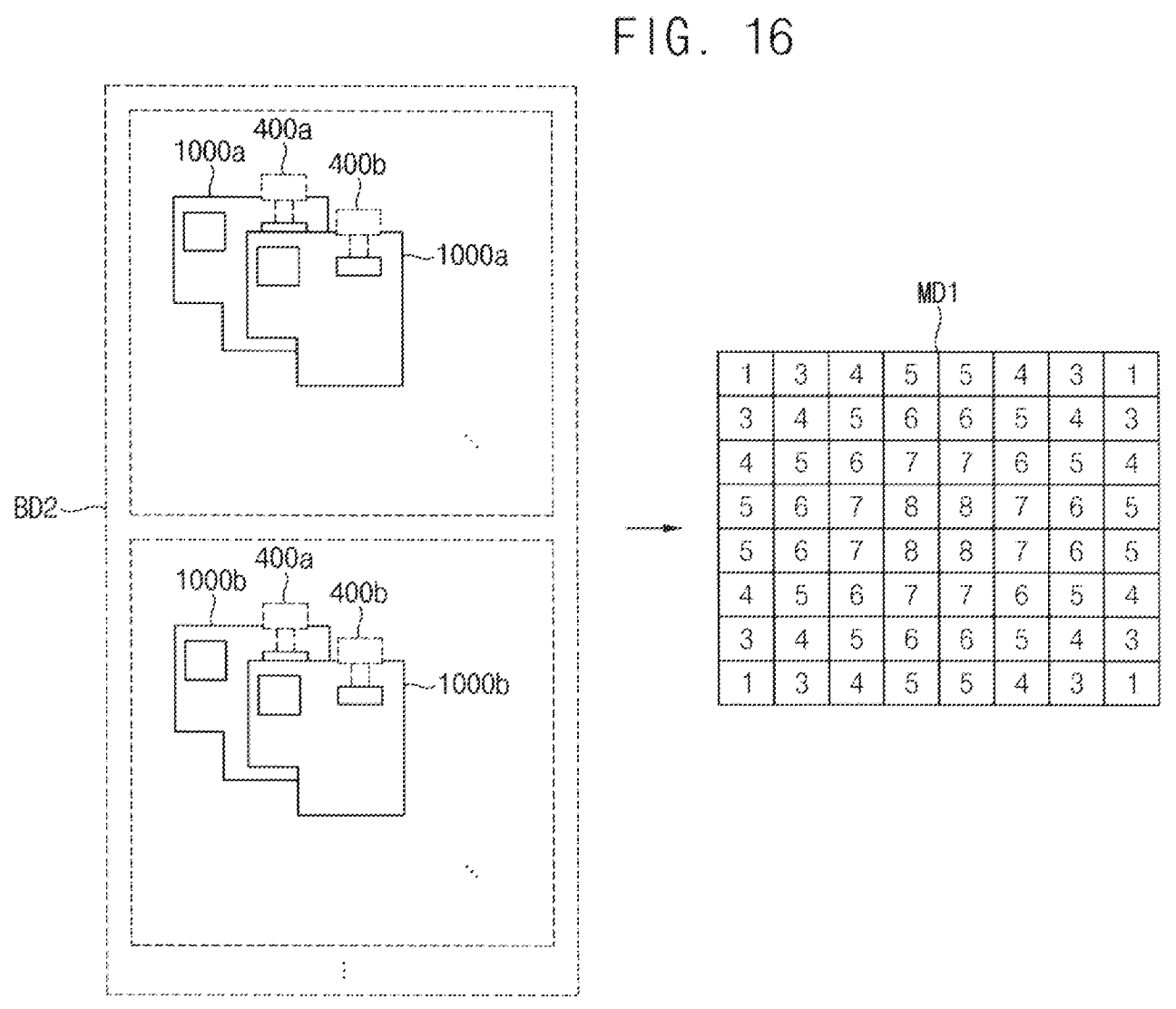
Figure 18:
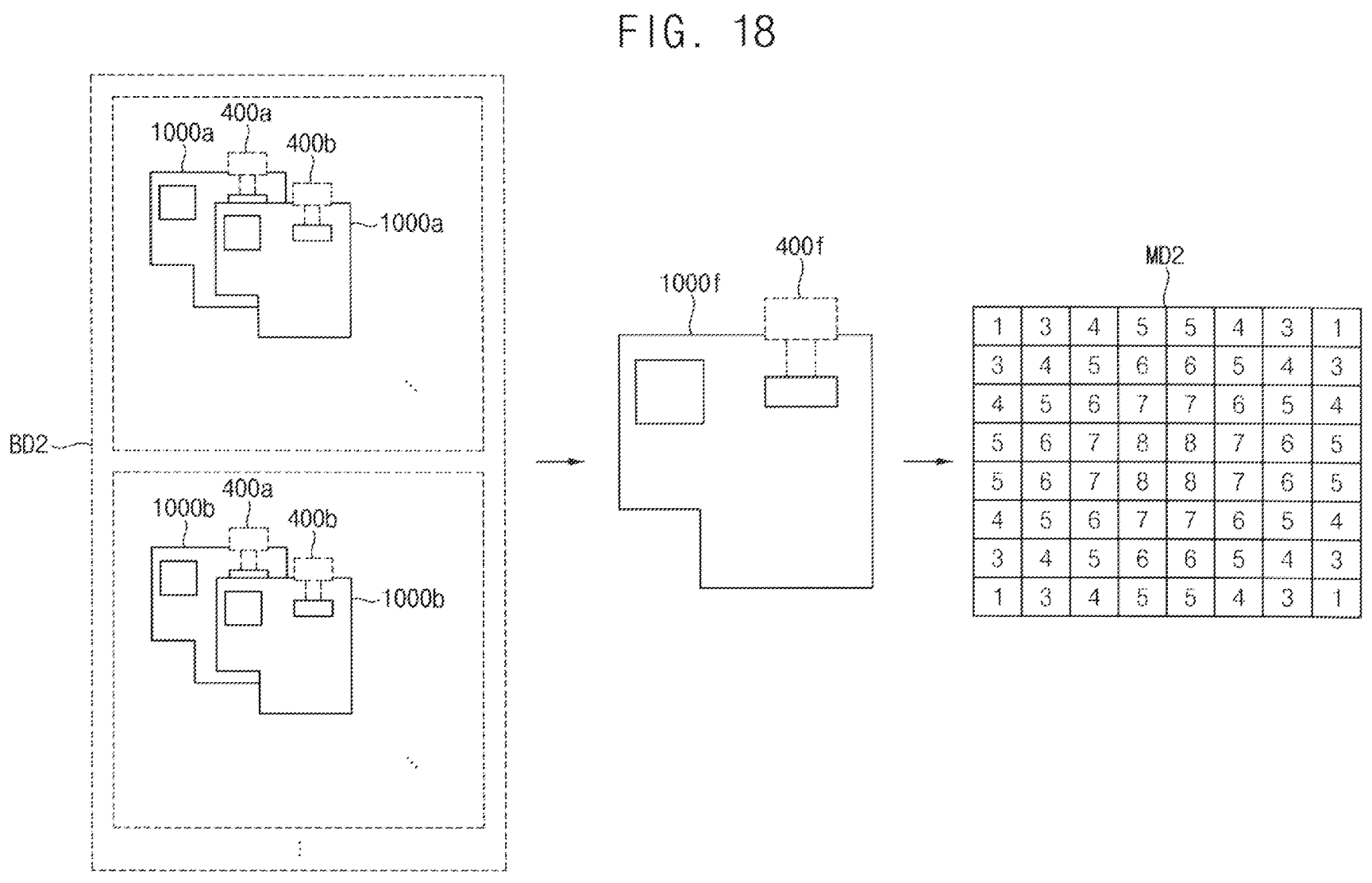
Figure 19:
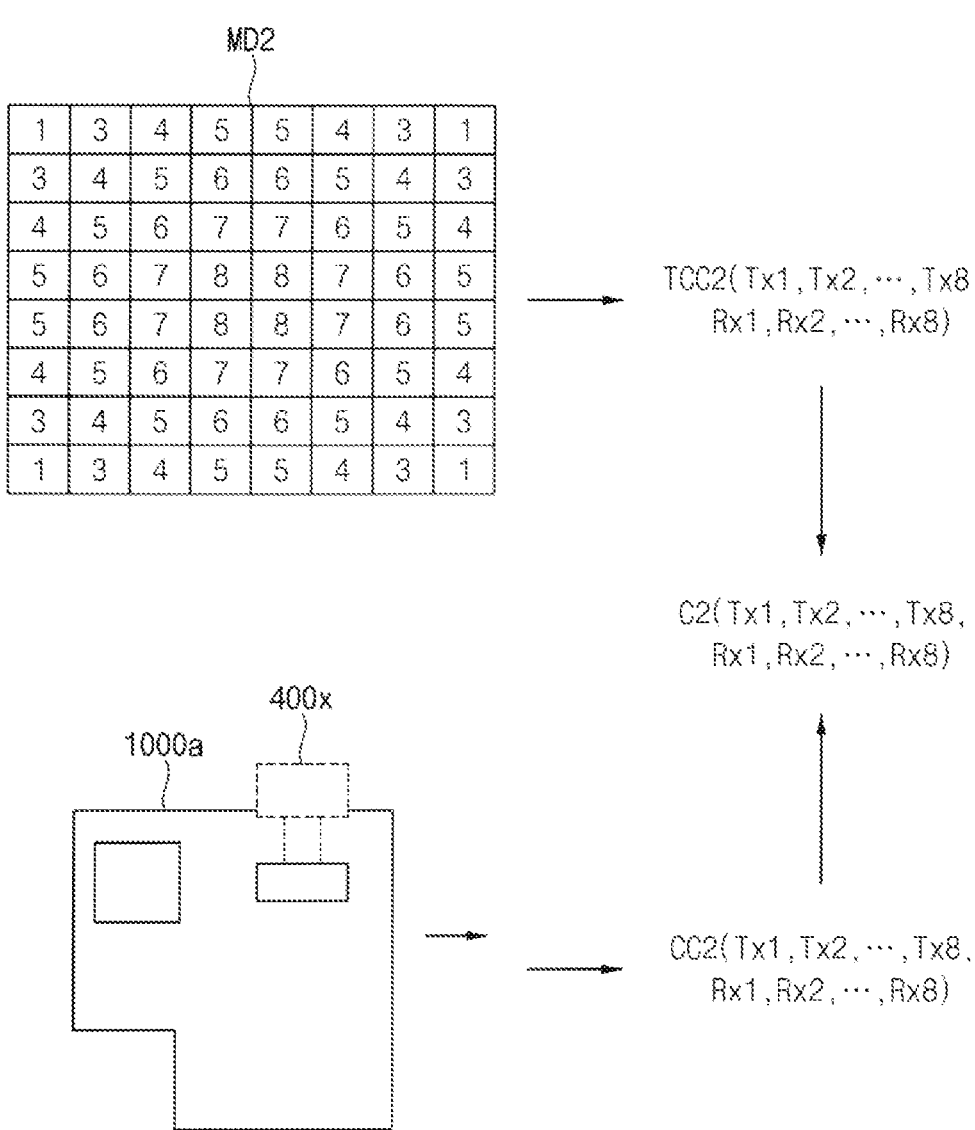
FIG. 19 is a diagram illustrating an example of generating of second compensation coefficients performed by the method of FIG. 15.

FIG. 15 is a flowchart illustrating a method of inspecting
a sensor according to embodiments of the inventive concept.
FIGS. 16 to 18 are diagrams illustrating an example of
generating of a second model MD2 performed by the
method of FIG. 15. FIG. 19 is a diagram illustrating an
example of generating of second compensation coefficients
C2(Tx1, Tx2, . . . , Tx8, Rx1, Rx2, . . . , Rx8) performed by
the method of FIG. 15. In FIGS. 16 to 19, numbers displayed
on nodes included in the second model MD2 and the current
sensor 400' are examples of the sensing values SV for the
nodes. The second inspection results TR2 of FIG. 12 are an
example. A set of the first inspection results TR1 for the
inspection environments (1000*a*, 1000*b*, . . . ) may be the
second inspection results TR2.

The method of inspecting the sensor according to the
present embodiment is substantially the same as the method
of FIG. 4 except for generating the second compensation
coefficients C2(Tx1, Tx2, . . . , Tx8, Rx1, Rx2, . . . , Rx8).
Thus, the same reference numerals are used to refer to the
same or similar element, and any repetitive explanation will
be omitted.

Referring to FIGS. 1 to 8 and 15 to 19, the method of FIG.
15 may generate the second model MD2 based on second
big-data BD2 including the second inspection results TR2
for sensors (400*a*, 400*b*, . . . ) of a same type connected to
a plurality of inspection environments (1000*a*, 1000*b*, . . . )
(S610), generate second target characteristic coefficients TCC2(Tx1, Tx2, Tx8, Rx1, Rx2, . . . , Rx8) for channels included in the second model MD2 (S620), generate second characteristic coefficients CC2(Tx1, Tx2, . . . , Tx8, Rx1, Rx2, . . . , Rx8) for channels included in a representative sensor 400x connected to a current inspection environment 1000a (S630), and generate second compensation coefficients C2(Tx1, Tx2, . . . , Tx8, Rx1, Rx2, Rx8) for the channels included in the representative sensor 400x based on the second target characteristic coefficients TCC2(Tx1, Tx2, . . . , Tx8, Rx1, Rx2, . . . , Rx8) and the second characteristic coefficients CC2(Tx1, Tx2, . . . , Tx8, Rx1, Rx2, . . . , Rx8) (S640).

Specifically, the method of FIG. 15 may generate the second model MD2 based on the second big-data BD2 including the second inspection results TR2 for the sensors (400a, 400b, . . . ) of the same type connected to the plurality of the inspection environments (1000a, 1000b, . . . ) (S610). Each of the inspection environments (1000a, 1000b, . . . ) may include a different test IC 200 and/or a different inspection jig 300 each other. The sensors (400a, 400b, . . . ) of the same type connected to the plurality of the inspection environments (1000a, 1000b, . . . ) may also include the current sensor 400'. The second model MD2 may be a representative model for compensating for a deviation when the deviation occurs between the sensors (400a, 400b, . . . ) of the same type connected to the plurality of the inspection environments (1000a, 1000b, . . . ) in the second inspection results TR2 due to a factor such as an inspection environment deviation.

According to an embodiment, the second model MD2 may be generated based on average values of the respective second inspection results TR2 for nodes included in the sensors (400a, 400b, . . . ) of the same type connected to the plurality of the inspection environments (1000a, 1000b, . . . ) (i.e., the average values of the respective second inspection results TR2 for nodes at the same location). For example, in the second model MD2, the average values of the respective second inspection results TR2 for the nodes included in the sensors (400a, 400b, . . . ) may be generated as inspection results. For example, the second model MD2 may include characteristics of a sensor and an inspection environment corresponding to the average values. For example, the second model MD2 may include information on the sensing values SV of the sensor and the inspection environment corresponding to the average values according to an arbitrary touch.

According to an embodiment, the second model MD2 may be generated based on median values of the respective second inspection results TR2 for nodes included in the sensors (400a, 400b, . . . ) of the same type connected to the plurality of the inspection environments (1000a, 1000b, . . . ) (i.e., the median values of the respective second inspection results TR2 for nodes at the same location). For example, when the second inspection result TR2 of a specific sensor 400f and a specific inspection environment 1000f is the mediate values of the second inspection results TR2, the second model MD2 may include characteristic of the specific sensor 400f and the specific inspection environment 1000f. For example, the second model MD2 may include information on the sensing values SV for the specific sensor 400f connected to the specific inspection environment 1000f according to an arbitrary touch.

According to an embodiment, the method of FIG. 15 may calculate average values of the respective second inspection results TR2 for the nodes included in the sensors (400a, 400b, . . . ) of the same type for each of the inspection environments (1000a, 1000b, . . . ). The second model MD2 may be generated based on median values of the average values for each of the inspection environments (1000a, 1000b, . . . ).

Specifically, the method of FIG. 15 may generate second target characteristic coefficients TCC2(Tx1, Tx2, . . . , Tx8, Rx1, Rx2, . . . , Rx8) for channels included in the second model MD2 (S620), generate second characteristic coefficients CC2(Tx1, Tx2, . . . , Tx8, Rx1, Rx2, . . . , Rx8) for channels included in a representative sensor 400x connected to a current inspection environment 1000a (S630), and generate second compensation coefficients C2(Tx1, Tx2, . . . , Tx8, Rx1, Rx2, . . . , Rx8) for the channels included in the representative sensor 400x based on the second target characteristic coefficients TCC2(Tx1, Tx2, . . . , Tx8, Rx1, Rx2, . . . , Rx8) and the second characteristic coefficients CC2(Tx1, Tx2, . . . , Tx8, Rx1, Rx2, . . . , Rx8) (S640).

The representative sensor 400x may be a sensor determined for constantly compensating for deviations in inspection results according to the sensors and the inspection environments. For example, the representative sensor 400x may output a value corresponding to median values of the second inspection results TR2 of the sensors (400a, 400b, . . . ) of the same type connected to the current inspection environment 1000a as the inspection results. For example, the representative sensor 400x may output a value corresponding to average values of the second inspection results TR2 of the sensors (400a, 400b, . . . ) of the same type connected to the current inspection environment 1000a as the inspection results.

The characteristic coefficients may represent an effect of the channels Tx and Rx on the sensing values SV. For example, the characteristic coefficients may represent an effect of the channels Tx and Rx on the sensing value SV when a touch is applied to the sensor 400. The method of FIG. 15 may generate the second compensation coefficients C2(Tx1, Tx2, . . . , Tx8, Rx1, Rx2, . . . , Rx8) for compensating for a difference between the second characteristic coefficients CC2(Tx1, Tx2, . . . , Tx8, Rx1, Rx2, . . . , Rx8) and the second target characteristic coefficients TCC2(Tx1, Tx2, . . . , Tx8). The same second compensation coefficients C2(Tx1, Tx2, . . . , Tx8, Rx1, Rx2, . . . , Rx8) may be applied to the sensors (400a, 400b, . . . ) of the same type connected to the same inspection environments 1000.

The sensing values SV may have a deviation in the inspection results according to the test IC 200 or the inspection jig 300 used for the inspection. In other words, when the inspection environment 1000 is changed, the inspection environment deviation may occur in the second inspection results TR2. Accordingly, the method of FIG. 15 may generate the second model MD2 for a representative inspection environment. Also, the method of FIG. 15 may generate compensation coefficients for the inspection environments (1000a, 1000b, . . . ) based on the second model MD2. As a result, the method of FIG. 15 may prevent the false positives caused by the inspection environment deviation and the productivity of the sensor may be increased.

FIG. 20 is a flowchart illustrating a method of inspecting a sensor according to embodiments of the inventive concept. FIG. 21 is a diagram illustrating an example of generating the node compensation map NM performed by the method of FIG. 20.

The method of inspecting the sensor according to the present embodiment is substantially the same as the method of FIG. 15 except for generating the node compensation map NM. Thus, the same reference numerals are used to refer to the same or similar element, and any repetitive explanation will be omitted.

Referring to FIGS. 1 to 3 and 15 to 21, the method of FIG. 20 may generate the node compensation map NM based on the first compensation coefficients CC1(Tx1, Tx2, . . . , Tx8, Rx1, Rx2, . . . , Rx8) and the second compensation coefficients CC2(Tx1, Tx2, . . . , Tx8, Rx1, Rx2, . . . , Rx8) (S650), and compensate for the sensing values SV for the nodes N included in the current sensor 400' based on the node compensation map NM (S660).

Specifically, the method of FIG. 20 may generate the node compensation map NM based on the first compensation coefficients CC1(Tx1, Tx2, . . . , Tx8, Rx1, Rx2, . . . , Rx8) and the second compensation coefficients CC2(Tx1, Tx2, . . . , Tx8, Rx1, Rx2, . . . , Rx8) (S650). Since the nodes N exists at an intersection of the transmit channels Tx and the reception channel Rx, the sensing values SV for the nodes N may be affected by the respective channels Tx and Rx. Accordingly, the compensation values (1 #, 2 #, . . . , 64 #) for the sensing values SV for nodes N are determined through the first compensation coefficients C1(Tx1, Tx2, . . . , Tx8, Rx1, Rx2, . . . , Rx8) and the second compensation coefficients CC2(Tx1, Tx2, . . . , Tx8, Rx1, Rx2, . . . , Rx8). The method of FIG. 20 may compensate for the sensing values SV for nodes N based on the compensation values (1 #, 2 #, . . . , 64 #). As a result, the method of FIG. 20 may facilitate compensation of the sensing value SV.

According to an embodiment, the node compensation map NM may be generated based on the first compensation coefficients C1(Tx1, Tx2, . . . , Tx8, Rx1, Rx2, . . . , Rx8), the second compensation coefficients CC2(Tx1, Tx2, . . . , Tx8, Rx1, Rx2, . . . , Rx8), and the size of each of the nodes included in the current sensor 400'. As the size of each of the nodes included in the current sensor 400' increases, the sensing values SV may increase when the same input (e.g., the input may mean a touch) is received. Conversely, as the size of each of the nodes included in the current sensor 400' decrease, the sensing values SV may decrease when the same input is received. Accordingly, by adjusting each of compensation values (1 #, 2 #, . . . , 64 #) according to the size of each of nodes N included in the current sensor 400', the sensing values SV may be compensated more accurately.

Figure 23:
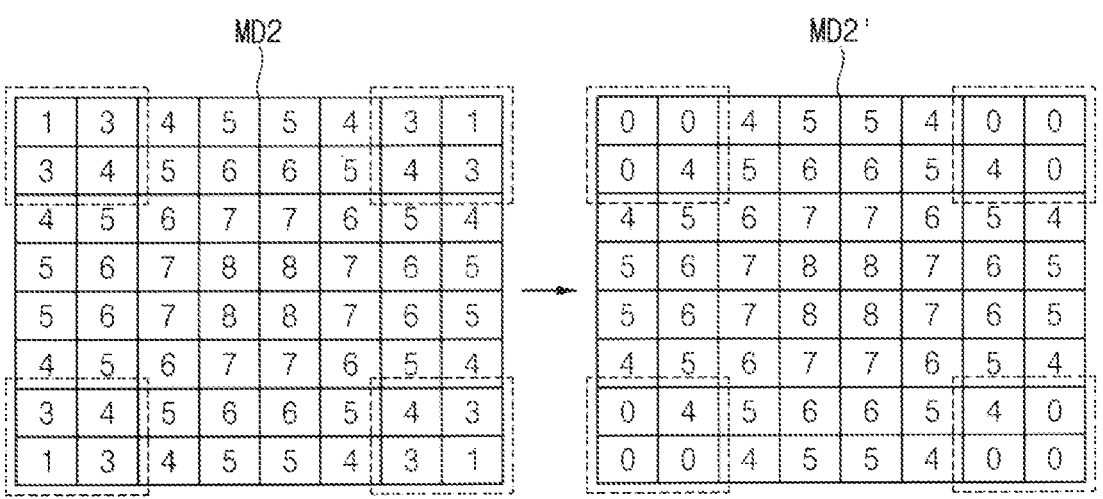
FIG. 23 is a diagram illustrating an example of masking performed by the method of FIG. 22.

FIG. 22 is a flowchart illustrating a method of inspecting a sensor according to embodiments of the inventive concept, and FIG. 23 is a diagram illustrating an example of masking performed by the method of FIG. 22.

The method of inspecting the sensor according to the present embodiment is substantially the same as the method of FIG. 15 except for masking the second model MD 2. Thus, the same reference numerals are used to refer to the same or similar element, and any repetitive explanation will be omitted.

Referring to FIGS. 1 to 3, 15 to 19, 22, and 23, the method of FIG. 22 may generate the second model MD2 based on the second big-data BD2 including the second inspection results TR2 for the sensors (400*a*, 400*b*, . . . ) of the same type connected to the plurality of the inspection environments (1000*a*, 1000*b*, . . . ) (S610), mask the first model MD1 and the second model MD2 (S570 and S670), generate the second target characteristic coefficients TCC2(Tx1, Tx2, . . . , Tx8, Rx1, Rx2, . . . , Rx8) for the channels included in the second model MD2 (S620), generate the second characteristic coefficients CC2(Tx1, Tx2, . . . , Tx8, Rx1, Rx2, . . . , Rx8) for the channels included in the representative sensor 400*x* connected to the current inspection environment 1000*a* (S630), and generate the second compensation coefficients C2(Tx1, Tx2, . . . , Tx8, Rx1, Rx2, . . . , Rx8) for the channels included in the representative sensor 400*x* based on the second target characteristic coefficients TCC2(Tx1, Tx2, . . . , Tx8, Rx1, Rx2, . . . , Rx8) and the second characteristic coefficients CC2(Tx1, Tx2, . . . , Tx8, Rx1, Rx2, . . . , Rx8) (S640).

Specifically, the method of FIG. 22 may mask the second model MD2 (S670). For example, as shown in FIG. 23, the current sensor 400' may be redesigned as the circular sensor 400'' after the inspection. In this case, the nodes of the corner may be cut off, and most of the cut nodes may not output the sensing values SV. Accordingly, the second model MD2 may mask unnecessary corner nodes. As a result, the sensing values SV output from the nodes of the corners of the masked second model MD2' may be zero.

Figure 24:
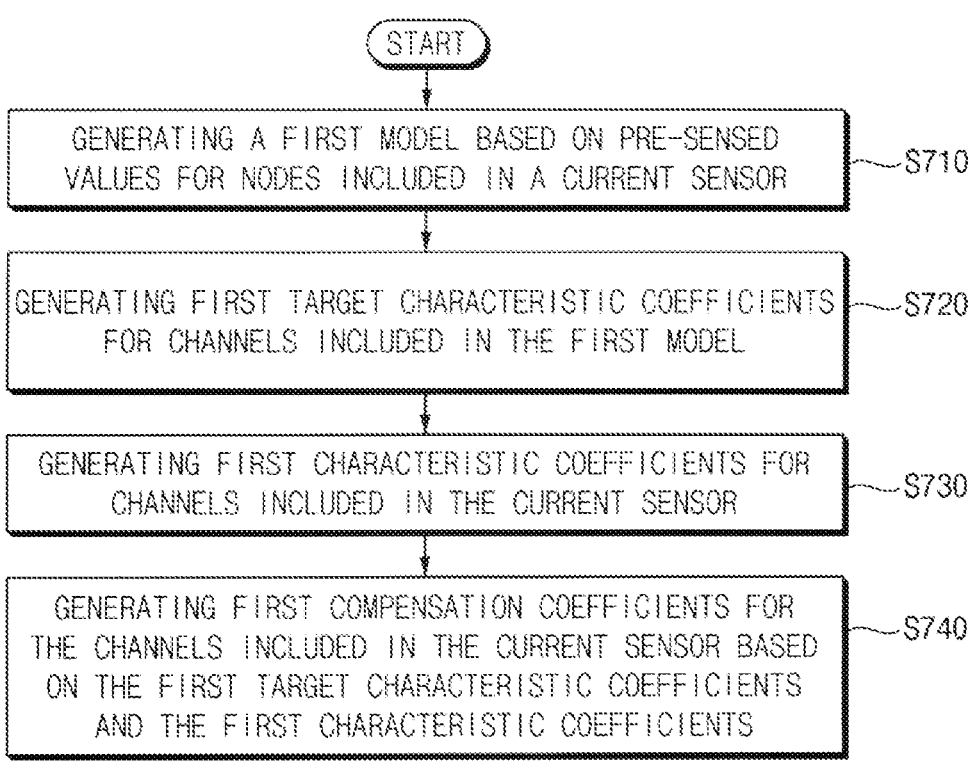
FIG. 24 is a flowchart illustrating a method of inspecting a sensor according to embodiments of the inventive concept.

FIG. 24 is a flowchart illustrating a method of inspecting a sensor according to embodiments of the inventive concept. FIGS. 25 to 27 are diagrams illustrating an example of generating of first model MD1 performed by the method of FIG. 24. In FIGS. 25 to 27, numbers displayed on nodes included in the first model MD1 are an example of the sensing values SV for the nodes. For example, in FIGS. 25 to 27, the numbers displayed on nodes included in the first model MD1 are the sensing values SV for the nodes according to a specific touch. the sensing values SV are an example.

The method of inspecting the sensor according to the present embodiment is substantially the same as the method of FIG. 4 except for generating the first model MD1. Thus, the same reference numerals are used to refer to the same or similar element, and any repetitive explanation will be omitted.

Referring to FIGS. 1 to 8 and 24 to 28, the method of FIG. 24 may generate the first model MD1 based on pre-sensed values (SV1, SV2, . . . ) for the nodes included in the current sensor 400' (S710), generate the first target characteristic coefficients TCC1(Tx1, Tx2, . . . , Tx8, Rx1, Rx2, . . . , Rx8) for the channels included in the first model MD1 (S720), generate the first characteristic coefficients CC1(Tx1, Tx2, . . . , Tx8, Rx1, Rx2, . . . , Rx8) for the channels included in the current sensor 400' (S730), and generate the first compensation coefficients C1(Tx1, Tx2, . . . , Tx8, Rx1, Rx2, . . . , Rx8) for the channels included in the current sensor 400' based on the first target characteristic coefficients TCC1(Tx1, Tx2, . . . , Tx8, Rx1, Rx2, . . . , Rx8) and the first characteristic coefficients CC1(Tx1, Tx2, . . . , Tx8, Rx1, Rx2, . . . , Rx8) (S740).

Specifically, the method of FIG. 24 may generate the first model MD1 based on pre-sensed values (SV1, SV2, . . . ) for the nodes included in the current sensor 400' (S710). The pre-sensed values (SV1, SV2, . . . ) are sensing values measured to generate the first model MD1 before the current sensor 400' is inspected. For example, the pre-sensed values (SV1, SV2, . . . ) may be sensed values measured by repeating operations of connecting the current sensor 400' to the same inspection environment and measuring sensed values before inspecting the current sensor 400'.

According to an embodiment, the first model MD1 may be generated based on average values of the respective pre-sensed values (SV1, SV2, . . . ) for the nodes included in the current sensor 400'. For example, in the first model MD1, the average values of the respective pre-sensed values (SV1, SV2, . . . ) for the nodes included in the current sensor 400' may be generated as sensing values. For example, the first model MD1 may include characteristics of a sensor corresponding to the average values. For example, the first model MD1 may include information on the sensing values SV of the sensor corresponding to the average values according to an arbitrary touch.

According to an embodiment, the first model MD1 may be generated based on median values of the respective pre-sensed values (SV1, SV2, . . . ) for the nodes included in the current sensor 400'. For example, in the first model MD1, the median values of the respective pre-sensed values (SV1, SV2, . . . ) for the nodes included in the current sensor 400' may be generated as sensing values. For example, the first model MD1 may include characteristics of a sensor corresponding to the median values. For example, the first model MD1 may include information on the sensing values SV of the sensor corresponding to the median values according to an arbitrary touch. Accordingly, the method of FIG. 24 generate the first model MD1 based on the numerous pre-sensed values (SV1, SV2, . . . ), so that an influence of the connection deviation on the generating of the first model MD1 may be reduced.

FIG. 28 is a flowchart illustrating a method of inspecting a sensor according to embodiments of the inventive concept.

The method of inspecting the sensor according to the present embodiment is substantially the same as the method of FIG. 24 except for generating the node compensation map NM. Thus, the same reference numerals are used to refer to the same or similar element, and any repetitive explanation will be omitted.

Referring to FIGS. 1 to 8 and 28, the method of FIG. 28 may generate the first model MD1 based on the pre-sensed values (SV1, SV2, . . . ) for the nodes N included in the current sensor 400' (S710), generate the first target characteristic coefficients TCC1(Tx1, Tx2, . . . , Tx8, Rx1, Rx2, . . . , Rx8) for the channels included in the first model MD1 (S720), generate the first characteristic coefficients CC1(Tx1, Tx2, . . . , Tx8, Rx1, Rx2, . . . , Rx8) for the channels included in the current sensor 400' (S730), generate the first compensation coefficients C1(Tx1, Tx2, . . . , Tx8, Rx1, Rx2, . . . , Rx8) for the channels included in the current sensor 400' based on the first target characteristic coefficients TCC1(Tx1, Tx2, . . . , Tx8, Rx1, Rx2, . . . , Rx8) and the first characteristic coefficients CC1(Tx1, Tx2, . . . , Tx8, Rx1, Rx2, . . . , Rx8) (S740), generate the node compensation map NM based on the first compensation coefficients CC1(Tx1, Tx2, Tx8, Rx1, Rx2, . . . , Rx8) (S750), and compensate for the sensing values SV for the nodes N included in the current sensor 400' based on the node compensation map NM (S760).

According to an embodiment, the node compensation map NM may be generated based on the first compensation coefficients C1(Tx1, Tx2, . . . , Tx8, Rx1, Rx2, . . . , Rx8) and the size of each of the nodes N included in the current sensor 400'. As the size of each of the nodes N included in the current sensor 400' increases, the sensing values SV may increase when the same input (e.g., the input may mean a touch) is received. Conversely, as the size of each of the nodes N included in the current sensor 400' decrease, the sensing values SV may decrease when the same input is received. Accordingly, by adjusting each of compensation values according to the size of each of nodes N included in the current sensor 400', the sensing values SV may be compensated more accurately.

Figure 29:
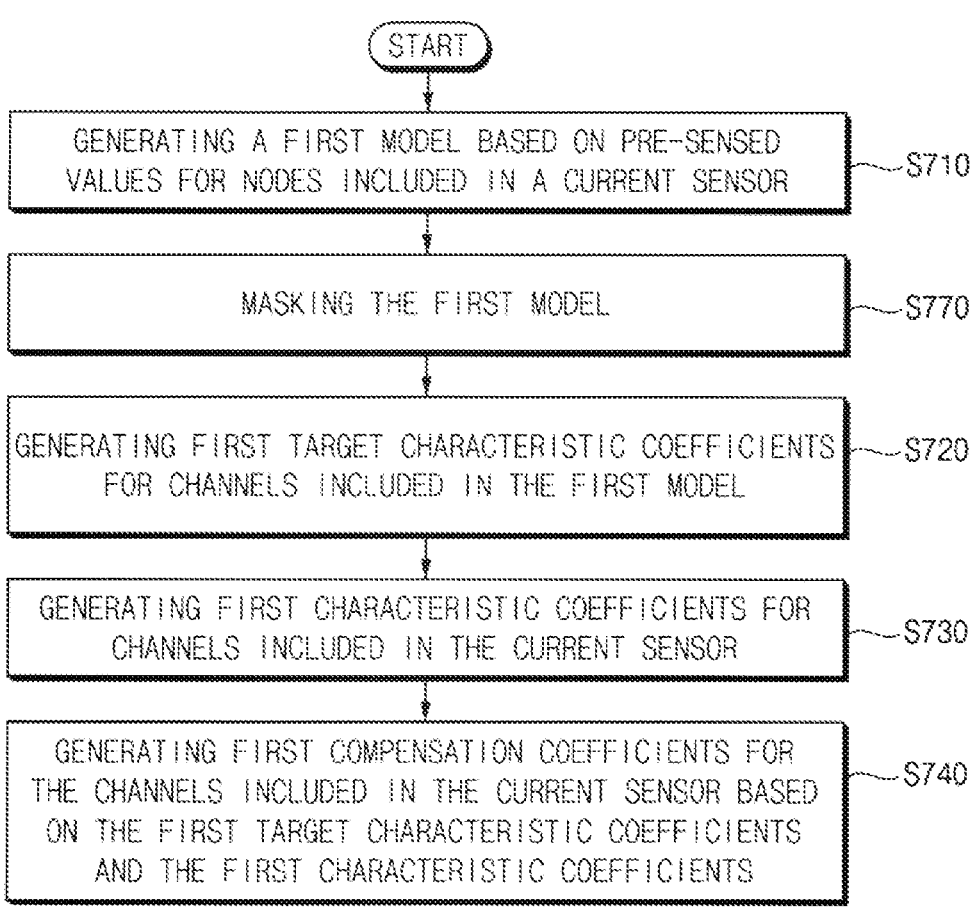
FIG. 29 is a flowchart illustrating; a method of inspecting a sensor according to embodiments of the inventive concept.

FIG. 29 is a flowchart illustrating; a method of inspecting a sensor according to embodiments of the inventive concept.

The method of inspecting the sensor according to the present embodiment is substantially the same as the method of FIG. 24 except for masking the first model MD1. Thus, the same reference numerals are used to refer to the same or similar element, and any repetitive explanation will be omitted.

Referring to FIGS. 1 to 8 and 29, the method of FIG. 29 may generate the first model MD1 based on the pre-sensed values (SV1, SV2, . . . ) for the nodes included in the current sensor 400' (S710), mask the first model MD1 (S770), generate the first target characteristic coefficients TCC1 (Tx1, Tx2, . . . , Tx8, Rx1, Rx2, . . . , Rx8) for the channels included in the first model MD1 (S720), generate the first characteristic coefficients CC1(Tx1, Tx2, . . . , Tx8, Rx1, Rx2, . . . , Rx8) for the channels included in the current sensor 400' (S730), generate the first compensation coefficients C1(Tx1, Tx2, . . . , Tx8, Rx1, Rx2, . . . , Rx8) for the channels included in the current sensor 400' based on the first target characteristic coefficients TCC1(Tx1, Tx2, . . . , Tx8, Rx1, Rx2, . . . , Rx8) and the first characteristic coefficients CC1(Tx1, Tx2, . . . , Tx8, Rx1, Rx2, . . . , Rx8) (S740).

Specifically, the method of FIG. 29 may mask the first model MD1 (S770). For example, the current sensor 400' may be redesigned as a circular sensor 400" after inspection. In this case, the nodes of the corner may be cut off, and most of the cut nodes may not output the sensing values SV. Accordingly, the first model MD1 may mask unnecessary corner nodes. As a result, the sensing values SV output from the nodes of the corners of the masked first model MD1' may be zero.

FIG. 30 is a flowchart illustrating a method of inspecting a sensor according to embodiments of the inventive concept.

The method of inspecting the sensor according to the present embodiment is substantially the same as the method of FIG. 24 except for generating the second compensation coefficients C2(Tx1, Tx2, . . . , Tx8, Rx1, Rx2, . . . , Rx8) and the node compensation map NM. Thus, the same reference numerals are used to refer to the same or similar element, and any repetitive explanation will be omitted.

Referring to FIG. 30, the method of FIG. 30 may generate the second model based on the second big-data including the second inspection results for the sensors of the same type connected to the plurality of the inspection environments (S810), generate the second target characteristic coefficients for the channels included in the second model (S820), generate the second characteristic coefficients for the channels included in the representative sensor connected to the current inspection environment (S830), generate the second compensation coefficients for the channels included in the representative sensor based on the second target characteristic coefficients and the second characteristic coefficients (S840), generate the node compensation map based on the first compensation coefficients and the second compensation coefficients (S850), and compensate for the sensing values for the nodes included in the current sensor based on the node compensation map (S860).

The inventive concept may be applied any electronic apparatus including the display apparatus. For example, the inventive concepts may be applied to a television (TV), a digital TV, a 3D TV, a mobile phone, a smart phone, a tablet computer, a virtual reality (VR) apparatus, a wearable electronic apparatus, a personal computer (PC), a home appliance, a laptop computer, a personal digital assistant (PDA), a portable multimedia player (PMP), a digital camera, a music player, a portable game console, a navigation apparatus, etc.

The method according to embodiments of the inventive concept may compensate for a connection deviation of inspection results that occurs when a sensor and an inspection environment are connected, by generating a compensation coefficient through a model generated based on big-data including the inspection results for a current inspection environment.

The method according to embodiments of the inventive concept may compensate for an inspection environment deviation of inspection results that occurs when the inspection environment used is different, by generating compensation coefficients through a model generated based on big-data including the inspection results for a plurality of inspection environments.

The method according to embodiments of the inventive concept may compensate for a connection deviation of inspection results that occurs when a sensor and an inspection environment are connected, by generating compensation coefficients through a model generated based on pre-sensed values.

The method according to embodiments of the inventive concept may prevent a decrease in productivity due to false positives, by compensating for the connection deviation and the inspection environment deviation.

Although certain embodiments and implementations have been described herein, other embodiments and modifications will be apparent from this description. Accordingly, the inventive concept is not limited to such embodiments, but rather to the broader scope of the appended claims and various obvious modifications and equivalent arrangements as would be apparent to a person of ordinary skill in the art.

What is claimed is:

1. A method of inspecting a sensor, the method comprising:

providing a current inspection environment comprising an inspection jig and a test integrated circuit to inspect sensor defects, the current inspection environment connectable to the sensors, the test integrated circuit receiving sensing values from the sensors through the inspection jig, wherein sensing values for nodes near an edge of the sensor are lower than sensing values for nodes near a center of the sensor;

generating a first model based on first data including first inspection results for sensors of a same type connected to the current inspection environment, the first data comprising the sensing values;

generating first target characteristic coefficients for channels included in the first model;

generating first characteristic coefficients for channels included in a current sensor; and generating first compensation coefficients for the channels included in the current sensor based on the first target characteristic coefficients and the first characteristic coefficients;

generating a node compensation map based on the first compensation coefficients and a size of each of the nodes included in the current sensor and compensating for sensing values for nodes included in the current sensor based on the node compensation map; and masking the first model based on redesigning the sensors of the same type.

2. The method of claim 1, wherein the first model is generated based on average values of the respective first inspection results for nodes included in the sensors of the same type connected to the current inspection environment.

3. The method of claim 1, wherein the first model is generated based on median values of the respective first inspection results for nodes included in the sensors of the same type connected to the current inspection environment.

4. The method of claim 1, further comprising:

generating a second model based on second data including second inspection results for sensors of a same type connected to a plurality of inspection environments;

generating second target characteristic coefficients for channels included in the second model;

generating second characteristic coefficients for channels included in a representative sensor connected to the current inspection environment; and generating second compensation coefficients for the channels included in the representative sensor based on the second target characteristic coefficients and the second characteristic coefficients.

5. The method of claim 4, further comprising masking the first model and the second model.

6. The method of claim 4, further comprising:

generating a node compensation map based on the first compensation coefficients and the second compensation coefficients; and compensating for sensing values for the nodes included in the current sensor based on the node compensation map.

7. The method of claim 6, wherein the node compensation map is generated based on the first compensation coefficients, the second compensation coefficients, and a size of each of the nodes included in the current sensor.

8. The method of claim 4, wherein:

the first model is generated based on average values of the respective first inspection results for nodes included in the sensors of the same type connected to the current inspection environment; and the second model is generated based on average values of the respective second inspection results for nodes included in the sensors of the same type connected to the plurality of the inspection environments.

9. The method of claim 4, wherein:

the first model is generated based on median values of the respective first inspection results for nodes included in the sensors of the same type connected to the current inspection environment; and the second model is generated based on median values of the respective second inspection results for nodes included in the sensors of the same type connected to the plurality of the inspection environments.

10. A method of inspecting a sensor, the method comprising:

providing an inspection environment comprising an inspection jig and a test integrated circuit to inspect sensor defects, the inspection environment being connectable to the sensor, the test integrated circuit receiving the pre-sensed values from the sensor through the inspection jig, wherein sensing values for nodes near an edge of the sensor are lower than sensing values for nodes near a center of the sensor;

generating a first model based on pre-sensed values for nodes included in the sensor, the pre-sensed values being measured by repeating operations of connecting the sensor to the inspection environment;

generating first target characteristic coefficients for channels included in the first model;

generating first characteristic coefficients for channels included in the sensor;

generating first compensation coefficients for the channels included in the sensor based on the first target characteristic coefficients and the first characteristic coefficients; and generating a node compensation map based on the first compensation coefficients and a size of each of the nodes included in the current sensor and compensating for sensing values for nodes included in the current sensor based on the node compensation map.

11. The method of claim 10, further comprising masking the first model.

12. The method of claim 10, wherein the first model is generated based on average values of the respective pre-sensed values for the nodes included in the sensor.

13. The method of claim 10, wherein the first model is generated based on median values of the respective pre-sensed values for the nodes included in the sensor.

14. The method of claim 10, further comprising:

generating a second model based on second data including second inspection results for sensors of a same type connected to a plurality of inspection environments;

generating second target characteristic coefficients for channels included in the second model;

generating second characteristic coefficients for channels included in a representative sensor connected to the inspection environment; and generating second compensation coefficients for the channels included in the representative sensor based on the second target characteristic coefficients and the second characteristic coefficients.

15. The method of claim 14, further comprising:

generating a node compensation map based on the first compensation coefficients and the second compensation coefficients; and compensating for sensing values for the nodes included in the sensor based on the node compensation map.

* * * * *